(12) United States Patent
Miyairi et al.

(10) Patent No.: US 8,829,522 B2
(45) Date of Patent: Sep. 9, 2014

(54) THIN FILM TRANSISTOR

(75) Inventors: Hidekazu Miyairi, Kanagawa (JP);
Shinya Sasagawa, Kanagawa (JP);
Motomu Kurata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 483 days.

(21) Appl. No.: 12/972,994

(22) Filed: Dec. 20, 2010

(65) Prior Publication Data

US 2011/0147755 A1 Jun. 23, 2011

(30) Foreign Application Priority Data

Dec. 21, 2009 (JP) ................................. 2009-289838

(51) Int. Cl.
*H01L 29/786* (2006.01)

(52) U.S. Cl.
USPC .................. 257/59; 257/66; 257/57; 257/72; 257/E29.291

(58) Field of Classification Search
USPC ............................................ 257/60; 438/301
See application file for complete search history.

(56) References Cited

U.S. PATENT DOCUMENTS

| | | | |
|---|---|---|---|
| 4,242,156 A | 12/1980 | Peel | |
| 4,409,134 A | 10/1983 | Yamazaki | |
| 4,581,620 A | 4/1986 | Yamazaki et al. | |
| 5,101,242 A | 3/1992 | Ikeda et al. | |
| 5,221,631 A | 6/1993 | Ikeda et al. | |
| 5,262,654 A | 11/1993 | Yamazaki | |
| RE34,658 E | 7/1994 | Yamazaki et al. | |
| 5,414,442 A | 5/1995 | Yamazaki et al. | |
| 5,453,858 A | 9/1995 | Yamazaki | |
| 5,514,879 A | 5/1996 | Yamazaki | |
| 5,571,578 A | 11/1996 | Kaji et al. | |
| 5,591,987 A | 1/1997 | Yamazaki et al. | |
| 5,614,732 A | 3/1997 | Yamazaki | |
| 5,648,662 A | 7/1997 | Zhang et al. | |

(Continued)

FOREIGN PATENT DOCUMENTS

| | | |
|---|---|---|
| CN | 101369539 A | 2/2009 |
| CN | 101369604 A | 2/2009 |

(Continued)

OTHER PUBLICATIONS

Kim.C et al., "A Novel Four-Mask-Count Process Architecture for TFT-LCDS,", SID Digest '00 : SID International Symposium Digest of Technical Papers, 2000, vol. 31, pp. 1006-1009.

(Continued)

*Primary Examiner* — Colleen Matthews
*Assistant Examiner* — William Harriston
(74) *Attorney, Agent, or Firm* — Nixon Peabody LLP; Jeffrey L. Costellia

(57) ABSTRACT

A thin film transistor having favorable electric characteristics with high productively is provided. The thin film transistor includes a gate insulating layer covering a gate electrode, a semiconductor layer in contact with the gate insulating layer, an impurity semiconductor layer which is in contact with part of the semiconductor layer and functions as a source region and a drain region, and a wiring in contact with the impurity semiconductor layer. The semiconductor layer includes a microcrystalline semiconductor region having a concave-convex shape, which is formed on the gate insulating layer side, and an amorphous semiconductor region in contact with the microcrystalline semiconductor region. A barrier region is provided between the semiconductor layer and the wiring.

18 Claims, 22 Drawing Sheets

(56) References Cited

U.S. PATENT DOCUMENTS

| | | | |
|---|---|---|---|
| 5,650,339 A | 7/1997 | Saito et al. | |
| 5,652,453 A | 7/1997 | Iwamatsu et al. | |
| 5,656,825 A | 8/1997 | Kusumoto et al. | |
| 5,677,236 A | 10/1997 | Saitoh et al. | |
| 5,701,167 A | 12/1997 | Yamazaki | |
| 5,726,461 A * | 3/1998 | Shimada et al. | 257/59 |
| 5,728,259 A | 3/1998 | Suzawa et al. | |
| 5,766,989 A | 6/1998 | Maegawa et al. | |
| 5,773,330 A | 6/1998 | Park | |
| 5,835,172 A | 11/1998 | Yeo et al. | |
| 5,849,601 A | 12/1998 | Yamazaki | |
| 5,859,445 A | 1/1999 | Yamazaki | |
| 5,864,150 A | 1/1999 | Lin | |
| 5,932,302 A | 8/1999 | Yamazaki et al. | |
| 5,989,998 A | 11/1999 | Sugahara et al. | |
| 6,010,922 A | 1/2000 | Hata et al. | |
| 6,011,277 A | 1/2000 | Yamazaki | |
| 6,013,930 A | 1/2000 | Yamazaki et al. | |
| 6,023,075 A | 2/2000 | Yamazaki | |
| 6,030,873 A | 2/2000 | Iwamatsu et al. | |
| 6,087,698 A | 7/2000 | Saito et al. | |
| 6,091,467 A | 7/2000 | Kubo et al. | |
| 6,100,558 A | 8/2000 | Krivokapic et al. | |
| 6,104,065 A | 8/2000 | Park | |
| 6,121,660 A | 9/2000 | Yamazaki et al. | |
| 6,153,893 A | 11/2000 | Inoue et al. | |
| 6,171,674 B1 | 1/2001 | Yamazaki et al. | |
| 6,183,816 B1 | 2/2001 | Yamazaki et al. | |
| 6,218,219 B1 | 4/2001 | Yamazaki et al. | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,387,737 B1 | 5/2002 | Yamazaki et al. | |
| 6,388,291 B1 | 5/2002 | Zhang et al. | |
| 6,426,245 B1 | 7/2002 | Kawasaki et al. | |
| 6,433,361 B1 | 8/2002 | Zhang et al. | |
| 6,468,617 B1 | 10/2002 | Yamazaki et al. | |
| 6,468,839 B2 | 10/2002 | Inoue et al. | |
| 6,498,369 B1 | 12/2002 | Yamazaki et al. | |
| 6,555,843 B1 | 4/2003 | Yamazaki et al. | |
| 6,558,756 B2 | 5/2003 | Sugahara et al. | |
| 6,559,548 B1 | 5/2003 | Matsunaga et al. | |
| 6,693,044 B1 | 2/2004 | Yamazaki et al. | |
| 6,737,676 B2 | 5/2004 | Yamazaki | |
| 6,744,008 B1 | 6/2004 | Kasahara et al. | |
| 6,756,258 B2 | 6/2004 | Zhang et al. | |
| 6,835,523 B1 | 12/2004 | Yamazaki et al. | |
| 6,864,583 B2 | 3/2005 | Matsunaga et al. | |
| 6,876,039 B2 | 4/2005 | Okihara | |
| 7,060,323 B2 | 6/2006 | Sugahara et al. | |
| 7,067,844 B2 | 6/2006 | Yamazaki | |
| 7,067,845 B2 | 6/2006 | Murakami et al. | |
| 7,098,479 B1 | 8/2006 | Yamazaki | |
| 7,102,718 B1 | 9/2006 | Yamazaki et al. | |
| 7,115,902 B1 | 10/2006 | Yamazaki | |
| 7,115,903 B2 | 10/2006 | Isobe et al. | |
| 7,157,358 B2 | 1/2007 | Hall et al. | |
| 7,164,171 B2 | 1/2007 | Yamazaki et al. | |
| 7,164,717 B2 | 1/2007 | Katsavounidis et al. | |
| 7,183,211 B2 | 2/2007 | Konno et al. | |
| 7,199,846 B2 | 4/2007 | Lim | |
| 7,259,429 B2 | 8/2007 | Yamazaki | |
| 7,365,805 B2 | 4/2008 | Maekawa et al. | |
| 7,611,930 B2 | 11/2009 | Yamazaki et al. | |
| 7,888,167 B2 | 2/2011 | Yamazaki et al. | |
| 8,017,946 B2 | 9/2011 | Yamazaki et al. | |
| 8,198,629 B2 | 6/2012 | Yamazaki et al. | |
| 8,395,158 B2 | 3/2013 | Yamazaki et al. | |
| 2002/0009890 A1 | 1/2002 | Hayase et al. | |
| 2002/0055209 A1 | 5/2002 | Kusumoto et al. | |
| 2002/0119590 A1* | 8/2002 | Flewitt | 438/48 |
| 2004/0026696 A1 | 2/2004 | Yamazaki et al. | |
| 2004/0113214 A1 | 6/2004 | Takenaka | |
| 2004/0206956 A1 | 10/2004 | Yanai et al. | |
| 2005/0012097 A1 | 1/2005 | Yamazaki | |
| 2005/0012151 A1 | 1/2005 | Yamaguchi et al. | |
| 2005/0022864 A1 | 2/2005 | Fujioka et al. | |
| 2005/0062129 A1 | 3/2005 | Komatsubara | |
| 2005/0115930 A1 | 6/2005 | Tanaka et al. | |
| 2005/0116305 A1 | 6/2005 | Hwang et al. | |
| 2006/0049449 A1 | 3/2006 | Iino et al. | |
| 2006/0113894 A1 | 6/2006 | Fujii et al. | |
| 2007/0034871 A1 | 2/2007 | Itoh et al. | |
| 2007/0045627 A1 | 3/2007 | Park et al. | |
| 2007/0080374 A1 | 4/2007 | Kurokawa | |
| 2007/0123035 A1 | 5/2007 | Sugimoto et al. | |
| 2007/0176176 A1 | 8/2007 | Yamazaki et al. | |
| 2007/0181945 A1 | 8/2007 | Nakamura | |
| 2007/0252179 A1 | 11/2007 | Isobe et al. | |
| 2007/0281400 A1 | 12/2007 | Yamazaki et al. | |
| 2008/0128703 A1 | 6/2008 | Ikeda et al. | |
| 2008/0128808 A1 | 6/2008 | Yamazaki et al. | |
| 2008/0132066 A1 | 6/2008 | Phan et al. | |
| 2009/0001375 A1 | 1/2009 | Yamazaki et al. | |
| 2009/0002591 A1 | 1/2009 | Yamazaki et al. | |
| 2009/0026454 A1 | 1/2009 | Kurokawa et al. | |
| 2009/0033818 A1 | 2/2009 | Nakajima et al. | |
| 2009/0045409 A1 | 2/2009 | Yamazaki et al. | |
| 2009/0047775 A1 | 2/2009 | Yamazaki et al. | |
| 2009/0057683 A1 | 3/2009 | Nakajima et al. | |
| 2009/0061574 A1 | 3/2009 | Nakajima et al. | |
| 2009/0140251 A1 | 6/2009 | Yamazaki | |
| 2009/0321737 A1 | 12/2009 | Isa et al. | |
| 2010/0133541 A1* | 6/2010 | Uchida et al. | 257/59 |
| 2011/0121300 A1* | 5/2011 | Miyairi et al. | 257/59 |
| 2011/0147745 A1* | 6/2011 | Sasagawa et al. | 257/57 |

FOREIGN PATENT DOCUMENTS

| | | | |
|---|---|---|---|
| CN | 101452961 A | 6/2009 | |
| CN | 101567397 A | 10/2009 | |
| DE | 197 36 204 B4 | 2/1998 | |
| EP | 0 532 314 A1 | 3/1993 | |
| EP | 0 535 979 A2 | 4/1993 | |
| EP | 0 826 791 A2 | 3/1998 | |
| EP | 1 045 447 A2 | 10/2000 | |
| EP | 1 050 599 A2 | 11/2000 | |
| EP | 1 182 275 A2 | 2/2002 | |
| EP | 1 207 217 A1 | 5/2002 | |
| EP | 1 333 476 A2 | 8/2003 | |
| EP | 1 536 482 A1 | 6/2005 | |
| JP | 57-071126 | 5/1982 | |
| JP | 58-092217 | 6/1983 | |
| JP | 59-072781 | 4/1984 | |
| JP | 59-150469 | 8/1984 | |
| JP | 01-117068 | 5/1989 | |
| JP | 01117068 A * | 5/1989 | H01L 29/78 |
| JP | 01-191479 | 8/1989 | |
| JP | 04-242724 | 8/1992 | |
| JP | 04-266019 | 9/1992 | |
| JP | 05-129608 | 5/1993 | |
| JP | 06-037313 | 2/1994 | |
| JP | 06-326312 | 11/1994 | |
| JP | 07-131030 | 5/1995 | |
| JP | 07-176753 | 7/1995 | |
| JP | 07-211708 | 8/1995 | |
| JP | 07-335906 | 12/1995 | |
| JP | 08-018055 | 1/1996 | |
| JP | 08-125195 | 5/1996 | |
| JP | 08-153699 | 6/1996 | |
| JP | 08-335702 | 12/1996 | |
| JP | 09-023010 | 1/1997 | |
| JP | 09-512667 | 12/1997 | |
| JP | 10-020298 | 1/1998 | |
| JP | 11-121761 | 4/1999 | |
| JP | 11-258636 | 9/1999 | |
| JP | 2000-077665 | 3/2000 | |
| JP | 2000-277439 | 10/2000 | |
| JP | 2001-007024 | 1/2001 | |
| JP | 2001-053283 | 2/2001 | |
| JP | 3474286 | 12/2003 | |
| JP | 2004-014958 | 1/2004 | |
| JP | 2005-019859 | 1/2005 | |
| JP | 2005-049832 | 2/2005 | |

(56) References Cited

FOREIGN PATENT DOCUMENTS

| JP | 2005-167051 | 6/2005 |
|---|---|---|
| JP | 2005-167207 | 6/2005 |
| JP | 2005-183774 | 7/2005 |
| JP | 2005-191546 | 7/2005 |
| JP | 2008-124392 | 5/2008 |
| JP | 2009-044134 | 2/2009 |
| WO | WO-2004/086487 A1 | 10/2004 |

OTHER PUBLICATIONS

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

Arai.T et al., "41.2: Micro Silicon Technology for Active Matrix OLED Display,", SID Digest '07 : SID International Symposium Digest of Technical Papers, 2007, vol. 38, pp. 1370-1373.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Stress-Induced Nucleation of Microcrystalline Silicon from Amorphous Phase,", Jpn. J. Appl. Phys.(Japanese Journal of Applied Physics), May 15, 2002, vol. 41, Part 1, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics), Mar. 1, 1998, vol. 37, Part 2, No. 3A, pp. L265-L268.

Lee.C et al., "How to Achieve High Mobility Thin Film Transistors by Direct Deposition of Silicon Using 13.56 MHZ RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities", Appl. Phys. Lett.(Applied Physics Letters), Dec. 18, 2006, vol. 89, No. 25, pp. 252101-1-252101-3.

Song.J et al., "34.1: Advanced Four-Mask Process Architecture for the A-SI TFT Array Manufacturing Method", SID Digest '02 : SID International Symposium Digest of Technical Papers, 2002, vol. 32, pp. 1038-1041.

Choi.S et al., "P-16: Novel Four-Mask Process in the FFS TFT-LCD With Optimum Multiple-Slit Design Applied by the Use of a Gray-Tone Mask," SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett.(Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics", Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75 Hydrogenated Nanocrystalline Silicon Plasma-Enhanced Chemical Vapor Deposition Films ,", J. Appl. Phys. (Journal of Applied Physics), Aug. 4, 2005, vol. 98, No. 3, pp. 034305-1-034305-7.

Chinese Office Action (Application No. 201010620963.3), dated May 29, 2014.

\* cited by examiner

THIN FILM TRANSISTOR

BACKGROUND OF THE INVENTION

1. Field of the Invention

The present invention relates to a thin film transistor, a method for manufacturing the thin film transistor, and a display device to which the thin film transistor is applied.

2. Description of the Related Art

As a kind of field effect transistor, a thin film transistor in which a channel region is formed in a semiconductor layer formed over a substrate having an insulating surface is known. Techniques in which amorphous silicon, microcrystalline silicon, or polycrystalline silicon is used for the semiconductor layer used in the thin film transistor have been disclosed (Patent Documents 1 to 5). A typical application of thin film transistors is a liquid crystal display television device, in which thin film transistors are put to practical use as switching transistors for each pixel that constitutes a display screen.

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

SUMMARY OF THE INVENTION

In formation of a thin film transistor in which a channel is formed using an amorphous silicon layer, problems such as low field-effect mobility and low on current arise. On the other hand, a thin film transistor in which a channel is formed using a microcrystalline silicon layer has a problem in that, whereas the field-effect mobility is higher than that of the thin film transistor in which a channel is formed using an amorphous silicon layer, off current is high, and thus sufficient switching characteristics cannot be obtained.

A thin film transistor in which a polycrystalline silicon layer is used for a channel formation region has characteristics such as much higher field-effect mobility and higher on current than the above-described two types of thin film transistors. Because of such characteristics, this thin film transistor can be used not only as a switching transistor provided in a pixel but also in a driver circuit for which high-speed operation is required.

However, formation of the thin film transistor in which a channel is formed using a polycrystalline silicon layer requires a crystallization step for a semiconductor layer and has a problem of higher manufacturing cost, as compared to formation of the thin film transistor in which a channel is formed using an amorphous silicon layer. For example, a laser annealing technique involved in the process for forming a polycrystalline silicon layer has a problem in that large-screen liquid crystal panels cannot be produced efficiently because the laser beam irradiation area is small.

A mother glass for manufacturing display panels has been grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm). From now on, the size of mother glasses is expected to grow to the 9th generation (2400 mm×2800 mm or 2450 mm×3050 mm) and the 10th generation (2950 mm×3400 mm). The increase in size of glass substrate is based on the concept of minimum cost design.

On the other hand, a technique with which a thin film transistor capable of high-speed operation can be manufactured with high productivity over a large-area mother glass substrate like that of the 10th generation (2950 mm×3400 mm) has not been established yet, which is a problem in industry.

Therefore, it is an object of an embodiment of the present invention to provide a thin film transistor which has favorable electric characteristics with high productivity.

One embodiment of the present invention is a thin film transistor including a gate insulating layer which covers a gate electrode, a semiconductor layer in contact with the gate insulating layer, an impurity semiconductor layer which is partly in contact with the semiconductor layer and functions as a source region and a drain region, and a wiring in contact with the impurity semiconductor layer. The semiconductor layer includes a microcrystalline semiconductor region which has a concave-convex shape and is formed on the gate insulating layer side and an amorphous semiconductor region which is in contact with the microcrystalline semiconductor region. A barrier region is provided between the semiconductor layer and the wiring.

Another embodiment of the present invention is a thin film transistor including a gate insulating layer which covers a gate electrode, an insulating layer, a back-gate electrode in contact with the insulating layer, a semiconductor layer, an impurity semiconductor layer, and a wiring where the semiconductor layer, the impurity semiconductor layer, and the wiring are provided between the gate insulating layer and the insulating layer. The semiconductor layer includes a microcrystalline semiconductor region which has a concave-convex shape and is formed on the gate insulating layer side and an amorphous semiconductor region which is in contact with the microcrystalline semiconductor region. A barrier region is provided between the semiconductor layer and the wiring.

The microcrystalline semiconductor region and the amorphous semiconductor region included in the semiconductor layer include nitrogen. The nitrogen concentration profile has a peak concentration within the range of $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive. Further, in the amorphous semiconductor region, semiconductor crystal grains whose grain size is equal to or greater than 1 nm and equal to or less than 10 nm may be dispersed.

Furthermore, the microcrystalline semiconductor region and the amorphous semiconductor region may include nitrogen, an NH group, or an NH$_2$ group. In addition, dangling bonds of semiconductor atoms which exist at the interface between adjacent microcrystalline semiconductor regions (i.e., crystal grain boundaries) and the interface between the microcrystalline semiconductor region and the amorphous semiconductor region are cross-linked with an NH group and thus defect levels are reduced, so that a path through which carriers are transferred is formed. Alternatively, a dangling bond is terminated with an NH$_2$ group and thus defect levels are reduced.

The barrier region provided between the semiconductor layer and the wiring is an insulating region or an amorphous region. The insulating region is formed of semiconductor nitride or semiconductor oxide. Examples of the semiconductor nitride include silicon nitride, silicon nitride oxide, and the like. Examples of the semiconductor oxide include silicon oxide, silicon oxynitride, and the like. Providing the insulating region between the semiconductor layer and the wiring makes the insulating region function as a barrier region, and thus, holes injected from the wiring to the semiconductor layer can be reduced.

The amorphous region of the barrier region is an amorphous region which has a wider band gap than the microcrystalline semiconductor region in the semiconductor layer, and it is typically formed of amorphous silicon, amorphous silicon germanium, amorphous germanium, or the like. Providing the amorphous region which has a wider band gap than the microcrystalline semiconductor region and is between the semiconductor layer and the wiring makes the amorphous region function as a barrier region, and thus holes injected from the wiring to the semiconductor layer can be reduced.

As a result, in the thin film transistor, resistance between the gate insulating layer and the source and drain regions of when voltage is applied to a source or drain electrode can be reduced, whereby the on current and field-effect mobility of the thin film transistor can be increased. The amorphous semiconductor region is a well-ordered semiconductor region which has fewer defects and whose tail of a level at a band edge in the valence band is steep; therefore, the band gap gets wider, and tunneling current does not easily flow. Therefore, by providing the amorphous semiconductor region on the back channel side, the off current of the thin film transistor can be reduced.

Here, the concentration is a value measured by secondary ion mass spectrometry (SIMS) unless a method for measuring the concentration is mentioned.

Note that the term "on current" refers to a current which flows between a source electrode and a drain electrode when a thin film transistor is on. For example, in the case of an n-channel thin film transistor, the on current refers to a current which flows between a source electrode and a drain electrode when a gate voltage is higher than a threshold voltage of a thin film transistor.

In addition, the term "off current" refers to a current which flows between a source electrode and a drain electrode when a thin film transistor is off. For example, in the case of an n-channel thin film transistor, the off current refers to a current which flows between a source electrode and a drain electrode when gate voltage is lower than the threshold voltage of the thin film transistor.

As described above, a thin film transistor with low off current, high on current, and high field-effect mobility can be manufactured with high productivity.

DETAILED DESCRIPTION OF THE INVENTION

Figure 1A:
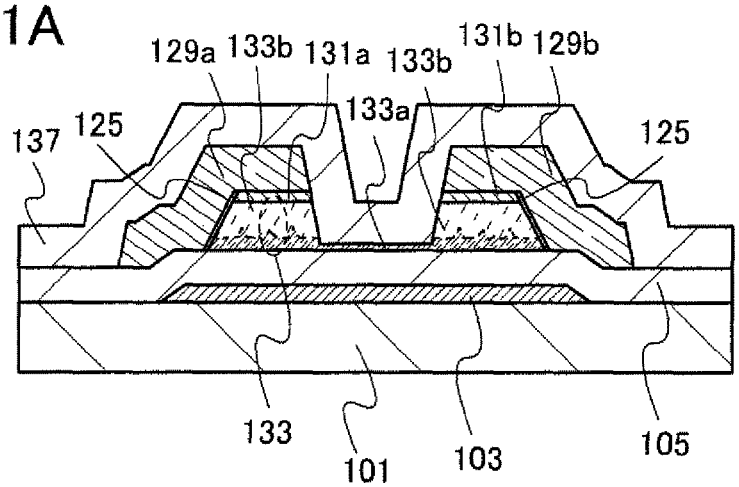
FIGS. 1A to 1D are cross-sectional views illustrating thin film transistors according to one embodiment of the present invention.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and an example. Note that reference numerals denoting the same portions are commonly used in different drawings.

Embodiment 1

In this embodiment, a thin film transistor according to an embodiment of the present invention will be described with reference to FIGS. 1A to 1D. Note that an n-channel thin film transistor has higher carrier mobility than a p-channel thin film transistor. Further, it is preferable that all thin film transistors formed over one substrate have the same polarity because the number of manufacturing steps can be reduced. Thus, in this embodiment, an n-channel thin film transistor will be described.

FIGS. 1A to 1D are cross-sectional views illustrating a thin film transistor described in this embodiment.

A thin film transistor illustrated in FIG. 1A includes, over a substrate 101, a gate electrode 103, a semiconductor layer 133, a gate insulating layer 105 provided between the gate electrode 103 and the semiconductor layer 133, impurity semiconductor layers 131a and 131b which are in contact with the semiconductor layer 133 and function as a source region and a drain region, and wirings 129a and 129b which are in contact with the impurity semiconductor layers 131a and 131b. In addition, an insulating region 125 functioning as a barrier region is provided on the side wall of the semiconductor layer 133, that is, provided between the semiconductor layer 133 and the wirings 129a and 129b. Further, an insulating layer 137 is provided to cover the semiconductor layer 133, the impurity semiconductor layers 131a and 131b, and the wirings 129a and 129b of the thin film transistor.

The semiconductor layer 133 includes a microcrystalline semiconductor region 133a and an amorphous semiconductor region 133b which indicates an amorphous semiconductor region divided into two parts (thus, also referred to as a pair of amorphous semiconductor regions 133b). The microcrystalline semiconductor region 133a has a surface which is in contact with the gate insulating layer 105 (hereinafter, referred to as a first surface) and a surface which faces the first surface and is in contact with the pair of amorphous semiconductor regions 133b and the insulating layer 137 (hereinafter, referred to as a second surface). The amorphous semiconductor region 133b has a surface which is in contact with the microcrystalline semiconductor region 133a (hereinafter, referred to as a first surface) and a surface which faces the first surface and is in contact with a pair of impurity semiconductor layers 131a and 131b (hereinafter, referred to as a second surface). That is, in a region of the semiconductor layer 133 which overlaps with the gate electrode 103, the microcrystalline semiconductor region 133a is in contact with the insulating layer 137 and the gate insulating layer 105 which is in contact with the gate electrode 103.

The area of the semiconductor layer 133 is smaller than that of the gate electrode 103, and the whole semiconductor layer 133 overlaps with the gate electrode 103.

Figure 2:
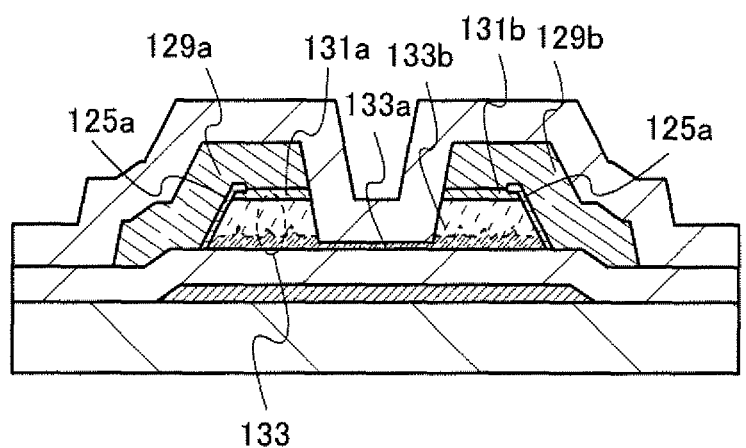
FIG. 2 is a cross-sectional view illustrating a thin film transistor according to one embodiment of the present invention.

Alternatively, as illustrated in FIG. 2, a barrier region provided on the side wall of the semiconductor layer 133, that is, provided between the semiconductor layer 133 and the wirings 129a and 129h may be extended to part of a surface of the pair of impurity semiconductor layers 131a and 131b, thereby forming an insulating region 125a.

The insulating region 125 and the insulating region 125a each functioning as a barrier region are formed by nitriding or oxidizing part of the semiconductor layer 133, and are typically formed of semiconductor nitride or semiconductor oxide. Examples of the semiconductor nitride include silicon nitride, silicon nitride oxide, and the like, and examples of the semiconductor oxide include silicon oxide, silicon oxynitride, and the like. Note that semiconductor nitride or semiconductor oxide included in the insulating region 125 and the insulating region 125a does not necessarily satisfy the stoichiometric proportion.

The thin film transistor described in this embodiment has a structure in which the area of the semiconductor layer 133 is smaller than that of the gate electrode 103 and the whole semiconductor layer 133 overlaps with the gate electrode 103; accordingly, the gate electrode 103 functions to block light traveling toward the semiconductor layer 133. Because of such a structure, irradiation of the semiconductor layer 133 with light such as external light from the substrate side can be reduced. Therefore, light-leakage current of the thin film transistor can be reduced. In the case where a microcrystalline semiconductor region is included in the semiconductor layer, the microcrystalline semiconductor region and a wiring are in contact with each other in the vicinity of the gate insulating layer, and a Schottky junction is formed in the contact region. Then, holes are injected from the contact region to the microcrystalline semiconductor region, which results in generation of off current. Thus, in the thin film transistor of this embodiment, holes injected from the wirings 129a and 129b to the semiconductor layer 133 can be reduced by providing the insulating region 125 or 125a that is a barrier region between the semiconductor layer 133 including the microcrystalline semiconductor region 133a and the wirings 129a and 129b; accordingly, the off current of the thin film transistor can be reduced. As described above, a thin film transistor with low light-leakage current and low off current can be obtained.

Figure 1B:
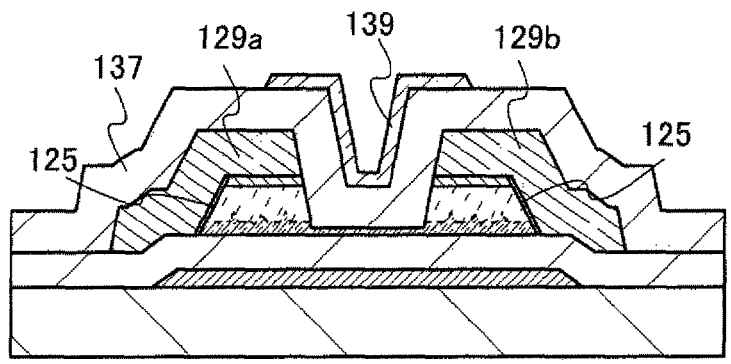

A thin film transistor illustrated in FIG. 1B is a dual-gate thin film transistor, which includes the insulating layer 137 covering the thin film transistor that has the same structure as that illustrated in FIG. 1A and an electrode which is over the insulating layer 137 and overlaps with the semiconductor layer 133. Note that the electrode which faces the semiconductor layer 133 with the insulating layer 137 interposed therebetween is here a back-gate electrode 139.

In the dual-gate thin film transistor, potential applied to the gate electrode 103 and potential applied to the back-gate electrode 139 can be different from each other. Thus, the threshold voltage of the thin film transistor can be controlled. Alternatively, the gate electrode 103 and the back-gate electrode 139 can be supplied with the same level of potential. Thus, channels are formed in the vicinity of the first surface and the second surface of the microcrystalline semiconductor region 133a.

In the dual-gate thin film transistor described in this embodiment, two channels where carriers flow are formed in the vicinity of the interface between the microcrystalline semiconductor region 133a and the gate insulating layer 105 and in the vicinity of the interface between the microcrystalline semiconductor region 133a and the insulating layer 137. Thus, the amount of transferring carriers is increased, and the on current and the field-effect mobility can be increased. In addition, the insulating region 125 or 125a that is a barrier region is provided between the semiconductor layer 133 and the wirings 129a and 129b, whereby holes injected from the wirings 129a and 129b to the semiconductor layer 133 can be reduced. As a result, a thin film transistor with low off current, high field-effect mobility, and high on current can be provided. Therefore, the size of the thin film transistor can be decreased, and high integration of a semiconductor device can be achieved. Further, when the thin film transistor described in this embodiment is used for a driver circuit of a display device, the size of the driver circuit can be decreased, which enables the frame of the display device to be narrowed.

Next, components of the thin film transistor are described below.

As the substrate 101, a glass substrate; a ceramic substrate; a plastic substrate which has high heat resistance enough to withstand a process temperature of this manufacturing process; or the like can be used. In the case where a substrate does not need a light-transmitting property, a metal substrate such as a stainless alloy, whose surface is provided with an insulating layer may be used. As a glass substrate, for example, an alkali-free glass substrate of barium borosilicate glass, aluminoborosilicate glass, aluminosilicate glass, or the like may be used. Further, as the glass substrate 101, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. Further, a semiconductor material typified by polycrystalline silicon that is doped with an impurity element such as phosphorus, an AgPdCu alloy, an Al—Nd alloy, an Al—Ni alloy or the like may also be used.

For example, the gate electrode 103 preferably has the following two-layer structures: a two-layer structure in which a molybdenum layer is stacked over an aluminum layer; a two-layer structure in which a molybdenum layer is stacked over a copper layer; a two-layer structure in which a titanium nitride layer or a tantalum nitride layer is stacked over a copper layer; a two-layer structure of a titanium nitride layer and a molybdenum layer; a two-layer structure of an alloy layer including copper, magnesium, and oxygen and a copper layer; a two-layer structure of an alloy layer including copper, manganese, and oxygen and a copper layer; a two-layer structure of an alloy layer including copper and manganese and a copper layer; and the like. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used. When a metal layer functioning as a barrier layer is stacked over a layer with low electric resistance, electric resistance can be reduced and diffusion of a metal element from the metal layer into the semiconductor layer can be prevented.

The gate insulating layer 105 can be formed as a single layer or a stacked layer using a silicon oxide layer, a silicon nitride layer, a silicon oxynitride layer, or a silicon nitride oxide layer by a CVD method, a sputtering method, or the like. Further, the gate insulating layer 105 is formed using a silicon oxide layer or a silicon oxynitride layer, so that fluctuation in threshold voltage of the thin film transistor can be decreased.

Note that silicon oxynitride means silicon that contains more oxygen than nitrogen. In the case where measurements are performed using Rutherford backscattering spectrometry (RBS) and hydrogen forward scattering (HFS), silicon oxynitride contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen as composition ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The semiconductor layer 133 has a structure in which the microcrystalline semiconductor region 133a and the amorphous semiconductor region 133b which are divided amorphous semiconductor regions are stacked. In addition, in this embodiment, the microcrystalline semiconductor region 133a has a concave-convex shape.

Here, a detailed structure of the semiconductor layer 133 is described. The enlarged view of a structure between the gate insulating layer 105 and the impurity semiconductor layer 131a functioning as a source region or a drain region illustrated in FIG. 1A is illustrated in FIG. 1C and FIG. 1D.

Figure 1C:
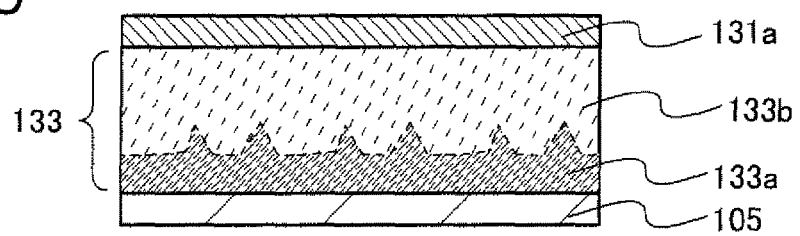
Figure 1D:
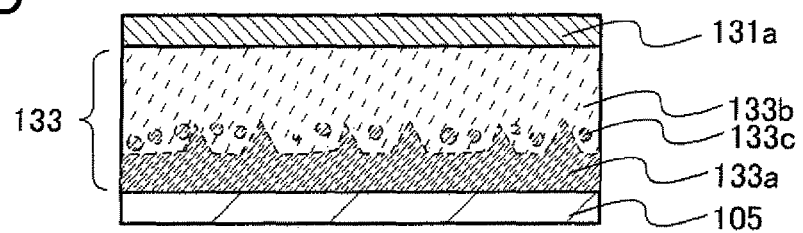

As shown in FIG. 1C, the microcrystalline semiconductor region 133a has a concave-convex shape. The projected portion has a projecting (conical or pyramidal) shape whose width decreases from the gate insulating layer 105 toward the amorphous semiconductor region 133b (a tip of the projected portion has an acute angle). Alternatively, the projected portion may be a projecting (inverted conical or inverted pyramidal) shape whose width increases from the gate insulating layer 105 toward the amorphous semiconductor region 133b.

The microcrystalline semiconductor region 133a is formed using a microcrystalline semiconductor. Note that a microcrystalline semiconductor is a semiconductor having an intermediate structure between amorphous and crystalline structures (including single crystal and polycrystal). A microcrystalline semiconductor is a semiconductor having a third state that is stable in terms of free energy and is a crystalline semiconductor having short-range order and lattice distortion, in which columnar or needle-like crystals having a grain size of from 2 nm to 200 nm, preferably from 10 nm to 80 nm, more preferably from 20 nm to 50 nm have grown in a direction of the normal to the substrate surface. Accordingly, there is a case where crystal grain boundaries are formed at the interface of column-like crystals or needle-like crystals.

A peak of the Raman spectrum of microcrystalline silicon, which is a typical example of a microcrystalline semiconductor, is shifted in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor includes at least 1 at. % or more of hydrogen or halogen to terminate a dangling bond. Moreover, the microcrystalline semiconductor may contain a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

The thickness of the microcrystalline semiconductor region 133a, that is, the distance from the interface between the microcrystalline semiconductor region 133a and the gate insulating layer 105 to the tip of the convex portion of the microcrystalline semiconductor region 133a is set to from 3 nm to 410 nm, preferably from 20 nm to 100 nm, so that the off current of the thin film transistor can be reduced.

Further, it is preferable that the concentration of oxygen and nitrogen contained in the semiconductor layer 133 measured by secondary ion mass spectrometry be lower than $1\times10^{18}$ atoms/cm$^3$ because the crystallinity of the microcrystalline semiconductor region 133a can be improved.

The amorphous semiconductor region 133b is formed using an amorphous semiconductor including nitrogen. Nitrogen of the amorphous semiconductor including nitrogen may exist, for example, as an NH group or an $NH_2$ group. The amorphous semiconductor is formed using amorphous silicon.

The amorphous semiconductor including nitrogen is a semiconductor having lower energy at an Urbach edge measured by a constant photocurrent method (CPM) or photoluminescence spectroscopy and a smaller amount of absorption spectra of defective levels as compared to a conventional amorphous semiconductor. That is, as compared with the conventional amorphous semiconductor, since the amorphous semiconductor including nitrogen is well-ordered semiconductor which has fewer defects and has a steep tail of a level at a band edge in the valence band, the band gap gets wider and tunneling current does not easily flow. Therefore, by providing an amorphous semiconductor including nitrogen on the back channel side, the off current of the thin film transistor can be reduced. In addition, by providing the amorphous semiconductor including nitrogen, the on current and the field-effect mobility of the thin film transistor can be increased.

Further, a peak region of a spectrum obtained by performing low-temperature photoluminescence spectroscopy on the amorphous semiconductor including nitrogen is 1.31 eV to 1.39 eV inclusive. Note that a peak region of a spectrum obtained by performing low-temperature photoluminescence spectroscopy on a microcrystalline semiconductor, typically a microcrystalline silicon, is 0.98 eV to 1.02 eV inclusive. Accordingly, the amorphous semiconductor including nitrogen is different from a microcrystalline semiconductor.

In addition to the amorphous semiconductor region 133b, an NH group or an $NH_2$ group may also be included in the microcrystalline semiconductor region 133a.

Further, as illustrated in FIG. 1D, when semiconductor crystal grains 133c whose grain size is 1 nm to 10 nm inclusive, preferably 1 nm to 5 nm inclusive are dispersedly included in the amorphous semiconductor region 133b, on current and filed-effect mobility can be increased.

A microcrystalline semiconductor having a projecting (conical or pyramidal) shape whose width decreases from the gate insulating layer 105 toward the amorphous semiconductor region 133b or a microcrystalline semiconductor having a projecting shape whose width increases from the gate insulating layer 105 toward the amorphous semiconductor region 133b is formed in the following manner. A microcrystalline semiconductor layer is formed under the condition that a microcrystalline semiconductor is deposited, and after that, the crystal is grown under the condition that the crystal grow is gradually reduced and an amorphous semiconductor is deposited.

Since the microcrystalline semiconductor region of the semiconductor layer 133 in the thin film transistor described in this embodiment has a conical or pyramidal shape or an inverted conical or pyramidal shape, resistance in the vertical direction (thickness direction), i.e., resistance of the semiconductor layer 133, of when the voltage is applied between the source and drain electrodes in an on state can be reduced. Further, tunneling current does not easily flow by provision of the amorphous semiconductor including nitrogen between the microcrystalline semiconductor region and the impurity semiconductor layer because the amorphous semiconductor including nitrogen is a well-ordered semiconductor which has fewer defects and whose tail of a level at a band edge in the valence band is steep. Thus, in the thin film transistor described in this embodiment, the on current and the field-effect mobility can be increased and the off current can be reduced.

The impurity semiconductor layers 131a and 131b are formed using amorphous silicon to which phosphorus is added, microcrystalline silicon to which phosphorus is added, or the like. Alternatively, the impurity semiconductor layers 131a and 131b can have a stacked structure of amorphous silicon to which phosphorus is added and microcrystalline silicon to which phosphorus is added. Note that, in the case of forming a p-channel thin film transistor as a thin film transistor, the impurity semiconductor layers 131a and 131b are formed using microcrystalline silicon to which boron is added, amorphous silicon to which boron is added, or the like. Note that when the ohmic contact is formed between the semiconductor layer 133 and the wirings 129a and 129b, the impurity semiconductor layers 131a and 131b are not necessarily formed.

Further, in the case where the impurity semiconductor layers 131a and 131b are formed using microcrystalline silicon to which phosphorus is added or microcrystalline silicon to which boron is added, a microcrystalline semiconductor layer, typically a microcrystalline silicon layer, is formed between the semiconductor layer 133 and the impurity semiconductor layers 131a and 131b, so that characteristics of the interference can be improved. As a result, resistance generated at the interface between the semiconductor layer 133 and the impurity semiconductor layers 131a and 131b can be reduced. Therefore, the amount of current flowing through the source region, the semiconductor layer, and the drain region of the thin film transistor can be increased and the on current and the field effect mobility can be increased.

The wirings 129a and 129b can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may also be used. Alternatively, crystalline silicon to which an impurity element which serves as a donor is added may be used. Further, the wirings 129a and 129b may have a stacked structure obtained as follows: a layer, which is in contact with the crystalline silicon to which an impurity element serving as a donor is added, is formed using titanium, tantalum, molybdenum, tungsten, or nitride of any of these elements, and then aluminum or an aluminum alloy is formed thereover. Further alternatively, the wirings 129a and 129b may have a stacked structure in which an upper side and a lower side of aluminum or an aluminum alloy are covered with titanium, tantalum, molybdenum, tungsten, or nitride of any of these elements.

The insulating layer 137 can be formed in a manner similar to that for the gate insulating layer 105. Alternatively, the insulating layer 137 can be formed using an organic resin layer. Examples of the organic resin layer include acrylic, epoxy, polyimide, polyamide, polyvinylphenol, and benzocyclobutene. Alternatively, a siloxane polymer can be used.

The back-gate electrode 139 can be formed in a manner similar to that of the wirings 129a and 129b. Further, the back-gate electrode 139 can be formed using indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like.

Alternatively, the back-gate electrode 139 can be formed using a conductive composition containing a light-transmitting conductive polymer. The back-gate electrode 139 preferably has a sheet resistivity of less than or equal to 10000 ohms/square and a light transmittance of greater than or equal to 70% at a wavelength of 550 nm. Further, the resistivity of the conductive polymer included in the conductive composition is preferably less than or equal to 0.1 Ω·cm.

As the conductive polymer, a so-called π-electron conjugated conductive polymer can be used. For example, polyaniline and/or a derivative thereof, polypyrrole and/or a derivative thereof, polythiophene and/or a derivative thereof; and a copolymer of two or more of aniline, pyrrole, and thiophene and/or a derivative thereof can be given.

Next, a form of the back-gate electrode is described with reference to FIGS. 3A to 3C that are top views of the thin film transistors.

Figure 3A:
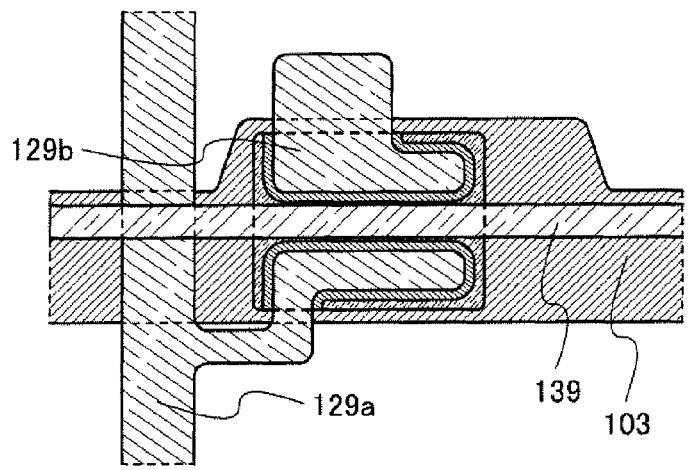
FIGS. 3A to 3C are top views illustrating thin film transistors according to one embodiment of the present invention.

As illustrated in FIG. 3A, the back-gate electrode 139 can be formed in parallel to the gate electrode 103. In this case, each of potential applied to the back-gate electrode 139 and potential applied to the gate electrode 103 can be controlled independently. Thus, a threshold voltage of the thin film transistor can be controlled.

Figure 3B:
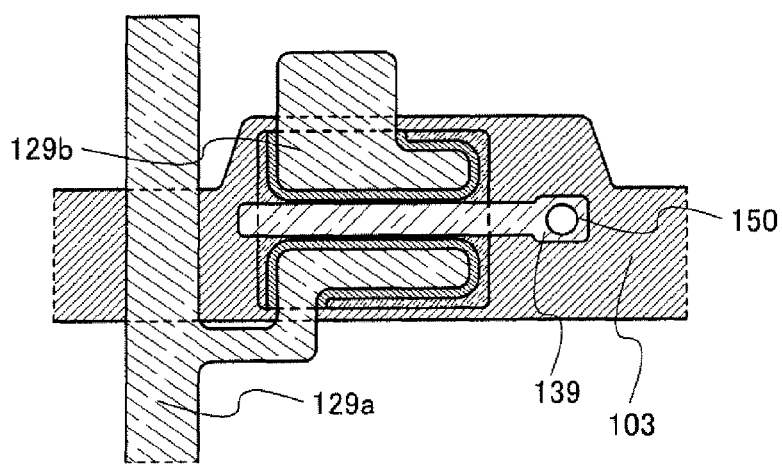

As illustrated in FIG. 3B, the back-gate electrode 139 can be connected to the gate electrode 103. That is, the gate electrode 103 and the back-gate electrode 139 can be connected through an opening 150 formed in the gate insulating layer 105 and the insulating layer 137. In this case, potential applied to the back-gate electrode 139 and potential applied to the gate electrode 103 are equivalent. As a result, in the microcrystalline semiconductor region in the semiconductor layer, regions where carriers flow, that is, channels are formed on the gate insulating layer 105 side and on the insulating layer 137 side. Thus, the on current of the thin film transistor can be increased.

Figure 3C:
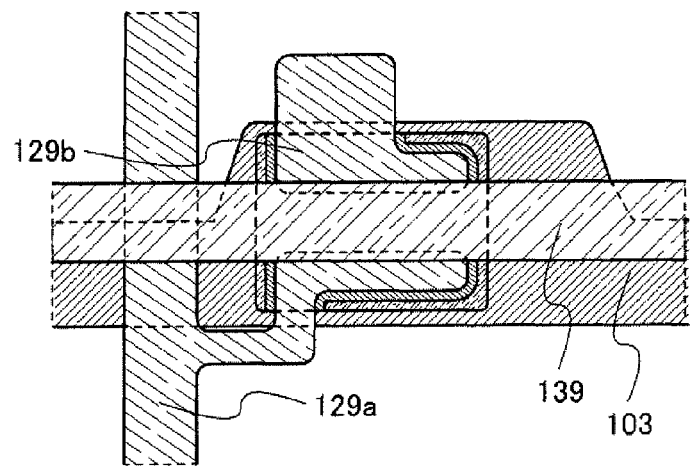

As illustrated in FIG. 3C, the back-gate electrode 139 may overlap with the wirings 129a and 129b with the insulating layer 137 interposed therebetween. Here, for description of form of FIG. 3C, the back-gate electrode 139 which is formed by making the back-gate electrode 139 of FIG. 3A overlap with the wirings 129a and 129b is used; however, the back-gate electrode 139 of FIG. 3B may be employed in the structure of FIG. 3C by making the back-gate electrode 139 of FIG. 3B overlap with the wirings 129a and 129b.

In the thin film transistor described in this embodiment, an insulating region which functions as a barrier region is provided between a semiconductor layer including a microcrystalline semiconductor region and a wiring. Further, the semiconductor layer includes the microcrystalline semiconductor region which is in contact with the gate insulating layer and an amorphous semiconductor region including nitrogen which is formed using a well-ordered semiconductor layer having fewer defects and a steep tail of a level at a band edge in the valence band. Thus, the light-leakage current and the off current are reduced, and the on current and the field-effect mobility are increased. Therefore, by using this thin film transistor for switching of a pixel in a display device, the display device achieves high contrast and high image quality. Further, since the size of the thin film transistor can be decreased, when a driver circuit is manufactured using this thin film transistor, the frame of the display device can be narrowed.

Embodiment 2

In this embodiment, a thin film transistor having a structure different from that of Embodiment 1 will be described with reference to FIGS. 4A to 4C. A difference between this embodiment and Embodiment 1 is in the barrier region.

Figure 4A:
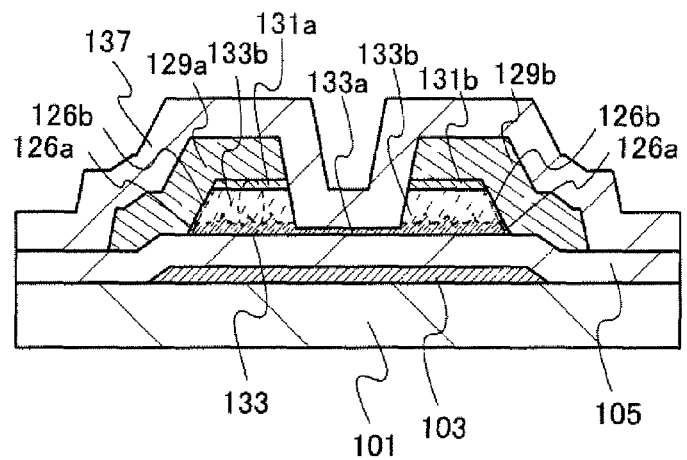
FIGS. 4A to 4C are cross-sectional views illustrating thin film transistors according to one embodiment of the present invention.

A thin film transistor illustrated in FIG. 4A includes, over the substrate 101, the gate electrode 103, the semiconductor layer 133 including the microcrystalline semiconductor region 133a and the pair of amorphous semiconductor regions 133b, the gate insulating layer 105 provided between the gate electrode 103 and the semiconductor layer 133, the impurity semiconductor layers 131a and 131b which are in contact with the semiconductor layer 133 and function as a source region and a drain region, and the wirings 129a and 129b which are in contact with the impurity semiconductor layers 131a and 131b. In addition, a first amorphous region 126a and a second amorphous region 126b are provided on the side wall of the semiconductor layer 133. Specifically, the first amorphous region 126a is provided between the microcrystalline semiconductor region 133a and the wirings 129a and 129b, and the second amorphous region 126b is provided between the amorphous semiconductor region 133b and the wirings 129a and 129b. Moreover, the insulating layer 137 is provided to cover the semiconductor layer 133, the impurity semiconductor layers 131a and 131b, the wirings 129a and 129b of the thin film transistor.

Figure 4B:
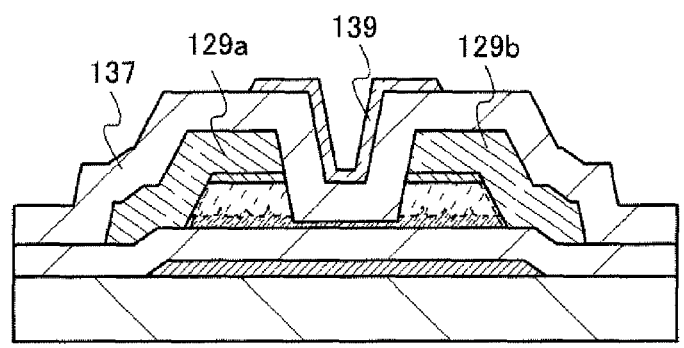

A thin film transistor illustrated in FIG. 4B is a dual-gate thin film transistor, which includes the insulating layer 137 covering the thin film transistor that has the same structure as that illustrated in FIG. 4A and the back-gate electrode 139 which is over the insulating layer 137 and overlaps with the semiconductor layer 133.

Figure 4C:
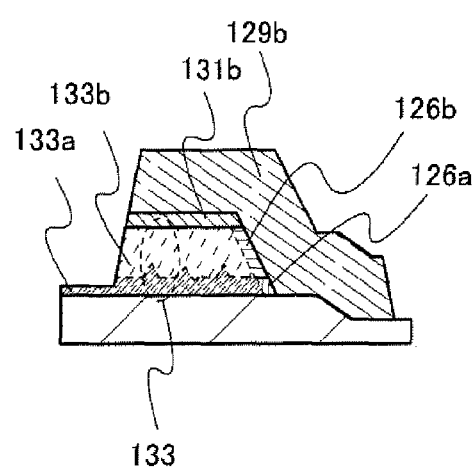

FIG. 4C is an enlarged view illustrating the vicinity of the semiconductor layer 133 and the wiring 129b of FIG. 4A and FIG. 4B. The first amorphous region 126a that is a barrier region is formed so that the density of the microcrystalline semiconductor region 133a is partly reduced. That is, the first amorphous region 126a is formed by making part of the microcrystalline semiconductor region 133a amorphous. The second amorphous region 126b that is a barrier region is part of the amorphous semiconductor region 133b. The first amorphous region 126a and the second amorphous region 126b each include amorphous silicon, amorphous silicon germanium, amorphous germanium, or the like.

The microcrystalline semiconductor region 133a has a small band gap which is equal to or greater than 1.0 eV and equal to or less than 1.2 eV. On the other hand, each of the amorphous semiconductor region 133b, the first amorphous region 126a that is a barrier region, and the second amorphous region 126b that is a barrier region has a wide band gap which is equal to or greater than 1.6 eV and equal to or less than 1.8 eV.

The energy levels of a wiring and a semiconductor layer are described below with reference to FIGS. 5A to 5C. Here, metal represents a wiring and Si represents a semiconductor.

Figure 5A:
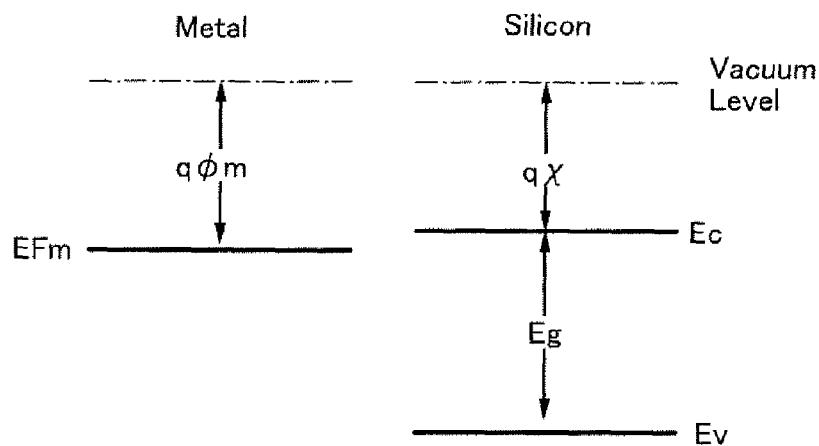
FIGS. 5A to 5C are band diagrams describing a transistor according to one embodiment of the present invention.

FIG. 5A shows, in a state where voltage is not applied to the gate electrode (Vg=0), a relation among the vacuum level, the work function (q$\phi$m), and the Fermi level (EFm) of the metal and a relation among the vacuum level, the electron affinity (q$\chi$), the band gap (Eg) of the semiconductor.

Figures 5B, 5C:
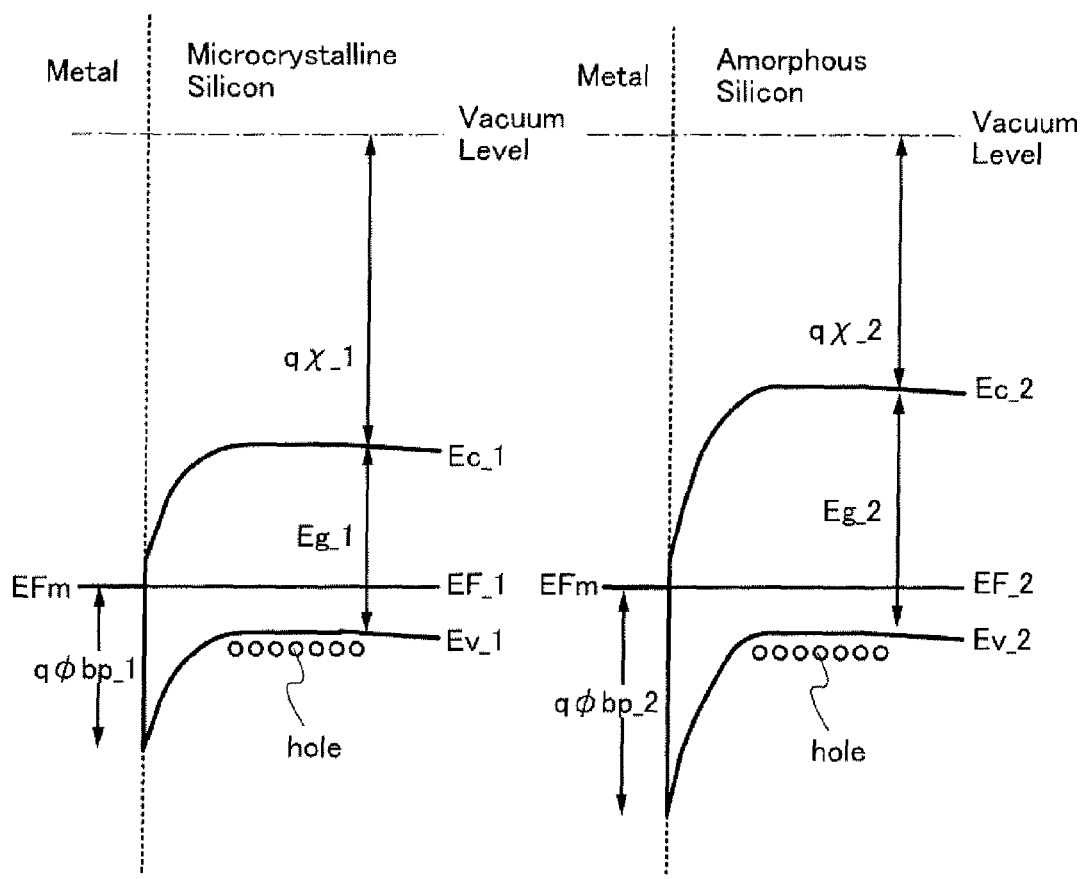

FIG. 5B and FIG. 5C each show the energy levels of a metal and a semiconductor in the state where negative voltage is applied to the gate electrode (Vg<0). FIG. 5B shows the case where the semiconductor is microcrystalline silicon, and FIG. 5C shows the case where the semiconductor is amorphous silicon. Note that $Eg\_1$, $Ec\_1$, $EF\_1$, $Ev\_1$, $q\phi bq\_1$, and $q\chi\_1$ represent the band gap, the bottom of the conduction band, the Fermi level, the upper end of the valence band, the barrier energy, and the electron affinity, respectively, of microcrystalline silicon. $Eg\_2$, $Ec\_2$, $EF\_2$, $Ev\_2$, $q\phi bq\_2$, and $q\chi\_2$ represent the band gap, the bottom of the conduction band, the Fermi level, the upper end of the valence band, the barrier energy, the electron affinity, respectively, of amorphous silicon.

The height of barrier $q\phi bq$ between the metal and the semiconductor in the sate where the negative voltage is applied to the gate electrode (Vg<0) is a difference between the valence band Ev and the Fermi level EFm at the junction surface between the metal and the semiconductor. The height of barrier qϕbq_1 in the case where the semiconductor is microcrystalline silicon can be represented by Mathematical Formula 1.

$$q\phi bq\_1 = Eg\_1 - q(\phi m - \chi\_1) \quad \text{(Mathematical Formula 1)}$$

The height of barrier qϕbq_2 in the case where the semiconductor is amorphous silicon can be represented by Mathematical Formula 2.

$$q\phi bq\_2 = Eg\_2 - q(\phi m - \chi\_2) \quad \text{(Mathematical Formula 2)}$$

Since the band gap Eg_2 of amorphous silicon is wider than the band gap Eg_1 of microcrystalline silicon, the height of barrier can be increased by employing amorphous silicon as a semiconductor in contact with metal. As a result, the amount of holes injected from the semiconductor to the metal is reduced, and the off current is reduced.

Thus, as illustrated in FIGS. 4A to 4C, the amorphous region having a wider band gap than the microcrystalline semiconductor region 133a is provided in the semiconductor layer so as to function as a barrier region between the microcrystalline semiconductor region 133a and the wirings 129a and 129b, whereby the off current of the thin film transistor can be reduced. The semiconductor of the thin film transistor illustrated in FIGS. 4A to 4C includes a microcrystalline semiconductor region which is in contact with the gate insulating layer and an amorphous semiconductor region including nitrogen which is formed using a well-ordered semiconductor layer having fewer defects and a steep tail of a level at a band edge in the valence band. Thus, the light-leakage current and the off current are reduced, and the on current and the field-effect mobility are increased. Therefore, by using this thin film transistor for switching of a pixel in a display device, the display device achieves high contrast and high image quality. Further, since the size of the thin film transistor can be decreased, when a driver circuit is manufactured using this thin film transistor, the frame of the display device can be narrowed.

Embodiment 3

In this embodiment, a thin film transistor having a structure different from those of Embodiment 1 and Embodiment 2 will be described with reference to FIGS. 6A and 6B. A difference between this embodiment and Embodiment 1 is in the structure of the semiconductor layer.

Figure 6A:
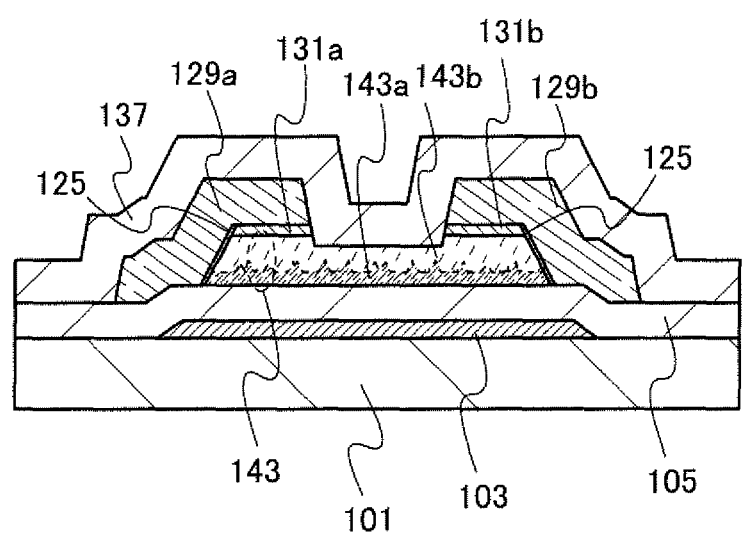
FIGS. 6A and 6B are cross-sectional views each illustrating a thin film transistor according to one embodiment of the present invention.

A thin film transistor illustrated in FIG. 6A includes, over the substrate 101, the gate electrode 103, a semiconductor layer 143, the gate insulating layer 105 provided between the gate electrode 103 and the semiconductor layer 143, the impurity semiconductor layers 131a and 131b which are in contact with the semiconductor layer 143 and function as a source region and a drain region, and the wirings 129a and 129b which are in contact with the impurity semiconductor layers 131a and 131b. In addition, the insulating region 125 functioning as a barrier region is provided on the side wall of the semiconductor layer 143, that is, between the semiconductor layer 143 and the wirings 129a and 129b. Moreover, the insulating layer 137 is formed to cover the semiconductor layer 143, the impurity semiconductor layers 131a and 131b, and the wirings 129a and 129b of the thin film transistor.

The semiconductor layer 143 includes a microcrystalline semiconductor region 143a and an amorphous semiconductor region 143b. The microcrystalline semiconductor region 143a has a surface which is in contact with the gate insulating layer 105 (hereinafter, referred to as a first surface) and a surface which faces the first surface and is in contact with the amorphous semiconductor region 143b (hereinafter, referred to as a second surface). The amorphous semiconductor region 143b has a surface which is in contact with the microcrystalline semiconductor region 143a (hereinafter, referred to as a first surface) and a surface which faces the first surface and is in contact with the pair of impurity semiconductor layers 131a and 131b and the insulating layer 137 (hereinafter, referred to a second surface).

Figure 7:
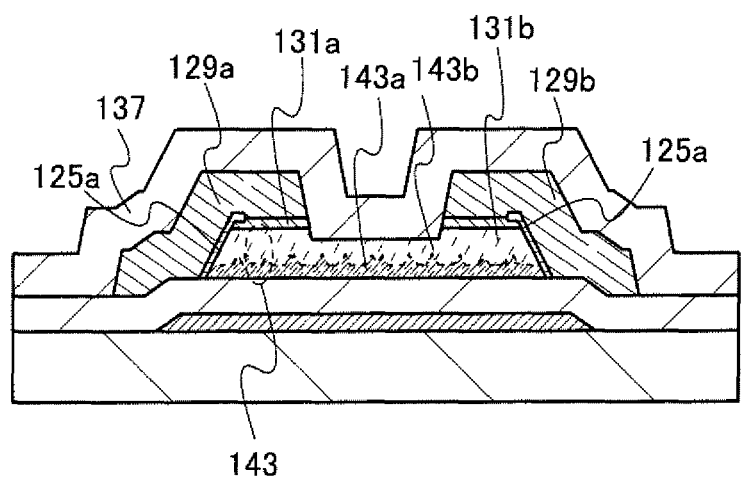
FIG. 7 is a cross-sectional view illustrating a thin film transistor according to one embodiment of the present invention.

Alternatively, as illustrated in FIG. 7, a barrier region provided on the side wall of the semiconductor layer 143, that is, provided between the semiconductor layer 143 and the wirings 129a and 129b may be extended to a part of a surface of the pair of impurity semiconductor layers 131a and 131b, thereby forming an insulating region 125a.

Figure 6B:
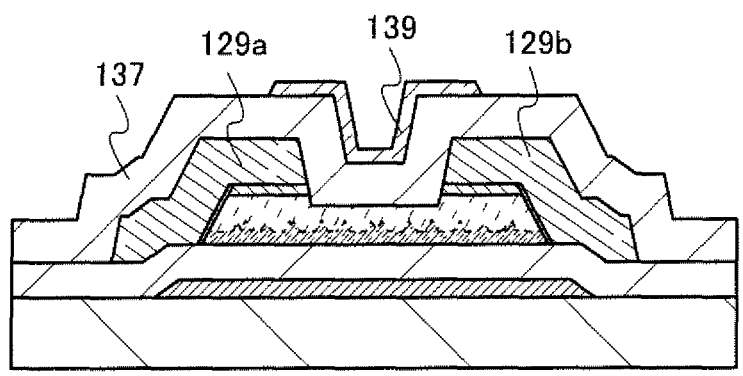

A thin film transistor illustrated in FIG. 6B is a dual-gate thin film transistor, which includes the insulating layer 137 covering the thin film transistor that has the same structure as that illustrated in FIG. 6A and the back-gate electrode 139 which is over the insulating layer 137 and overlaps with the semiconductor layer 143. That is in a region of the semiconductor layer 143 which overlaps with the gate electrode 103, the microcrystalline semiconductor region 143a is in contact with the gate insulating layer 105 which is in contact with the gate electrode 103, and the amorphous semiconductor region 143b is in contact with the insulating layer 137 which is in contact with the back-gate electrode 139.

The microcrystalline semiconductor region 143a is formed using a material similar to that of the microcrystalline semiconductor region 133a described in Embodiment 1. The amorphous semiconductor region 143b is formed using a material similar to that of the amorphous semiconductor region 133b described in Embodiment 1. In this embodiment, the amorphous semiconductor region 143b is not divided, and the first surface of the microcrystalline semiconductor region 143a is in contact with the gate insulating layer 105 and the second surface is in contact with the amorphous semiconductor region 143b, which is a different point from the thin film transistor described in Embodiment 1.

The thin film transistor of this embodiment includes an insulating region functioning as a barrier region between the wiring and the semiconductor layer including a microcrystalline semiconductor region. The semiconductor layer includes a microcrystalline semiconductor region which is in contact with the gate insulating layer and an amorphous semiconductor region including nitrogen which is formed using a well-ordered semiconductor layer having fewer defects and a steep tail of a level at a band edge in the valence band. The amorphous semiconductor region is provided on the back channel side. Thus, the light-leakage current and the off current are reduced, and the on current and the field-effect mobility are increased. Therefore, by using this thin film transistor for switching of a pixel in a display device, the display device achieves high contrast and high image quality.

Embodiment 4

In this embodiment, a thin film transistor having a structure which is different from those of Embodiments 1 to 3 will be described with reference to FIGS. 8A to 8C. A difference between this embodiment and Embodiment 3 is in the barrier region.

Figure 8A:
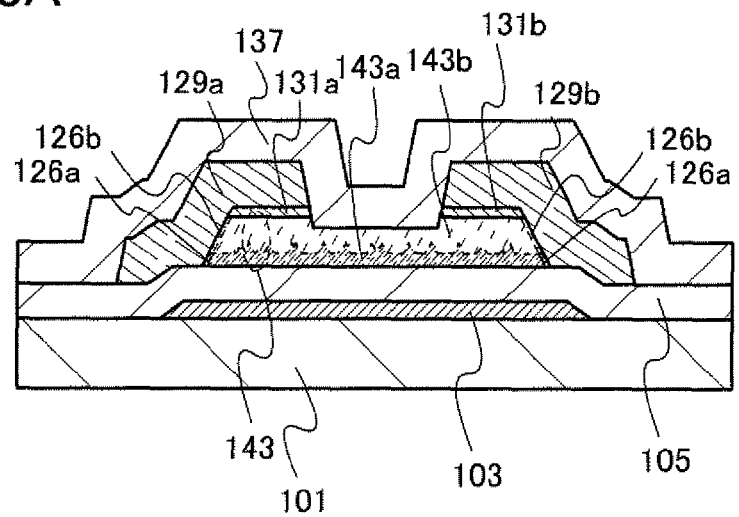
FIGS. 8A to 8C are cross-sectional views each illustrating a thin film transistor according to one embodiment of the present invention.

A thin film transistor illustrated in FIG. 8A includes, over the substrate 101, the gate electrode 103, the semiconductor layer 143, the gate insulating layer 105 provided between the gate electrode 103 and the semiconductor layer 143, the impurity semiconductor layers 131a and 131b which are in contact with the semiconductor layer 143 and function as a source region and a drain region, and the wirings 129a and 129b which are in contact with the impurity semiconductor layers 131a and 131b. In addition, the first amorphous region 126a and the second amorphous region 126b functioning as a barrier region are provided on the side wall of the semiconductor layer 143, that is, provided between the semiconductor layer 143 and the wirings 129a and 129b. Moreover, the insulating layer 137 is formed to cover the semiconductor layer 143, the impurity semiconductor layers 131a and 131b, and the wirings 129a and 129b of the thin film transistor.

Figure 8B:
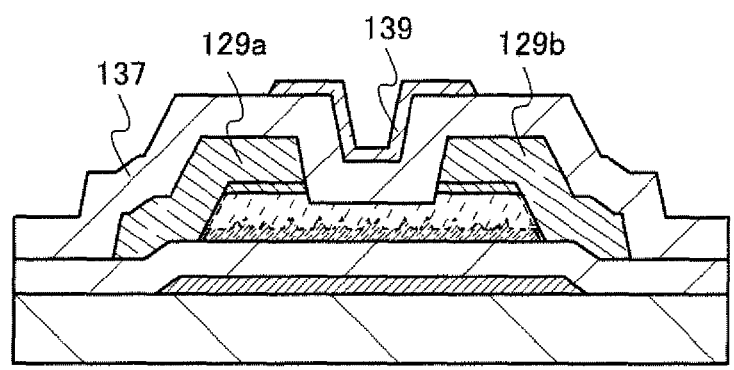

A thin film transistor illustrated in FIG. 8B is a dual-gate thin film transistor, which includes the insulating layer 137 covering the thin film transistor that has the same structure as that illustrated in FIG. 8A and the back-gate electrode 139 which is over the insulating layer 137 and overlaps with the semiconductor layer 143.

Figure 8C:
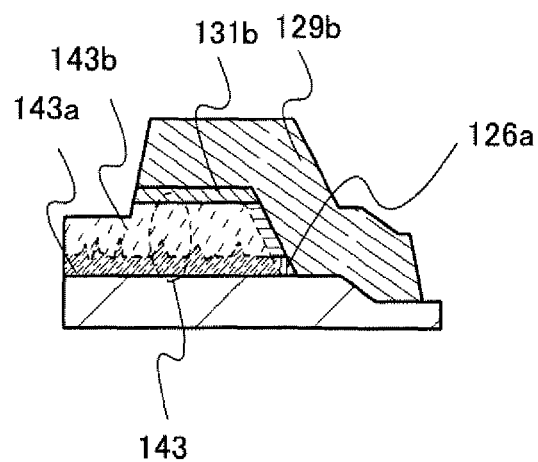

FIG. 8C is an enlarged view illustrating the vicinity of the semiconductor layer 143 and the wiring 129b of FIG. 8A and FIG. 8B. The first amorphous region 126a that is a barrier region is formed so that the density of the microcrystalline semiconductor region 143a is partly reduced. That is, the first amorphous region 126a is formed by making part of the microcrystalline semiconductor region 143a amorphous. The second amorphous region 126b that is a barrier region is part of the amorphous semiconductor region 143b. The first amorphous region 126a and the second amorphous region 126b each include amorphous silicon, amorphous silicon germanium, amorphous germanium, or the like.

The microcrystalline semiconductor region 143a has a small band gap which is equal to or greater than 1.0 eV and equal to or less than 1.2 eV. On the other hand, each of the amorphous semiconductor region 143b, the first amorphous region 126a that is a barrier region, and the second amorphous region 126b that is a barrier region has a wide band gap which is equal to or greater than 1.6 eV and equal to or less than 1.8 eV.

The thin film transistor of this embodiment includes the amorphous region which has a wider band gap than the microcrystalline semiconductor region and is provided between the semiconductor layer including the microcrystalline semiconductor region and the wiring to function as a barrier region. The semiconductor layer includes the microcrystalline semiconductor region which is in contact with the gate insulating layer and the amorphous semiconductor region including nitrogen which is formed using a well-ordered semiconductor layer having fewer defects and a steep tail of a level at a band edge in the valence band. The amorphous semiconductor region is provided on the back channel side. Thus, the light-leakage current and the off current are reduced, and the on current and the field-effect mobility are increased. Therefore, by using this thin film transistor for switching of a pixel in a display device, the display device achieves high contrast and high image quality.

Embodiment 5

In this embodiment, a thin film transistor having a structure different from those of Embodiments 1 to 4 will be described with reference to FIG. 9.

Figure 9:
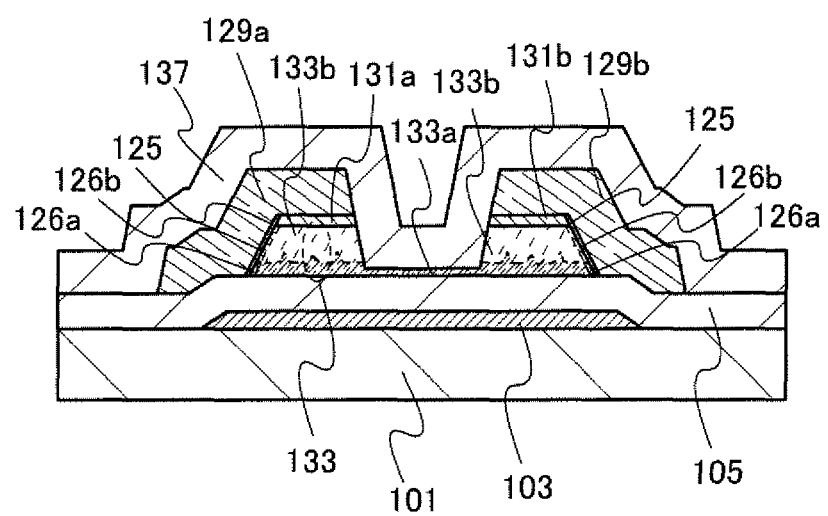
FIG. 9 is a cross-sectional view illustrating a thin film transistor according to one embodiment of the present invention.

A thin film transistor illustrated in FIG. 9 includes, over the substrate 101, the gate electrode 103, the semiconductor layer 133 including the microcrystalline semiconductor region 133a and the pair of amorphous semiconductor regions 133b, the gate insulating layer 105 provided between the gate electrode 103 and the semiconductor layer 133, the impurity semiconductor layers 131a and 131b which are in contact with the semiconductor layer 133 and function as a source region and a drain region, and the wirings 129a and 129b which are in contact with the impurity semiconductor layers 131a and 131b. In addition, a barrier region which includes the first amorphous region 126a, the second amorphous region 126b, and the insulating region 125 is provided between the semiconductor layer 133 and the wirings 129a and 129b. The insulating region 125 is provided in contact with the wirings 129a and 129b. The first amorphous region 126a is provided between the insulating region 125 and the microcrystalline semiconductor region 133a, and the second amorphous region 126b is provided between the insulating region 125 and the amorphous semiconductor region 133b. The insulating layer 137 is provided to cover the semiconductor layer 133, the impurity semiconductor layers 131a and 131b, and the wirings 129a and 129b of the thin film transistor.

Note that although FIG. 9 illustrates a single-gate thin film transistor, a dual-gate thin film transistor can also be formed. Further, instead of the microcrystalline semiconductor region 133b formed of the divided region, the amorphous semiconductor region which is not divided may be provided over the microcrystalline semiconductor region 133a as described in Embodiment 3 and Embodiment 4.

In the thin film transistor of this embodiment, a barrier region including the amorphous region and the insulating region is provided between the semiconductor layer 133 and the wirings 129a and 129b. Thus, the off current can be further reduced as compared with the case of Embodiments 1 to 4.

Embodiment 6

A method for manufacturing the thin film transistor described in Embodiment 1 will be described below with reference to FIGS. 10A to 10D, FIGS. 11A and 11B, FIGS. 12A to 12D, and FIGS. 22A to 22D. In this embodiment, a method for manufacturing an n-channel thin film transistor will be described.

Figure 10A:
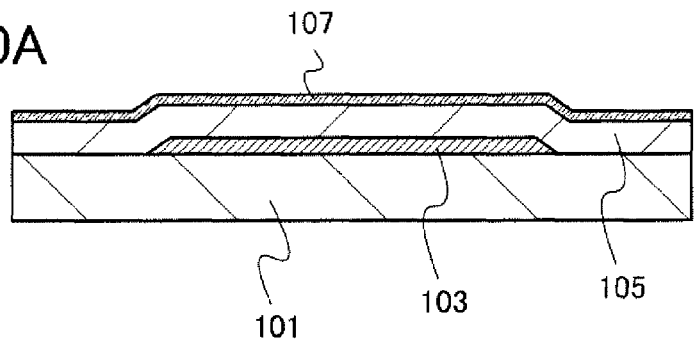
FIGS. 10A to 10D are cross-sectional views illustrating a method for manufacturing a thin film transistor according to one embodiment of the present invention.

As illustrated in FIG. 10A, the gate electrode 103 is formed over the substrate 101. Then, the gate insulating layer 105 is formed so as to cover the gate electrode 103. After that, a microcrystalline semiconductor layer 107 is formed.

As the substrate 101, the substrate 101 described in Embodiment 1 can be used as appropriate.

The gate electrode 103 is formed using a material used for the gate electrode 103 described in Embodiment 1 as appropriate. The gate electrode 103 can be formed in the following manner: a conductive layer is formed over the substrate 101 using the above-described material by a sputtering method or a vacuum evaporation method; a mask is formed over the conductive layer by a photolithography method, an inkjet method, or the like; and the conductive layer is etched using the mask. Further, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a layer of a nitride of any of the aforementioned metal materials may be provided between the substrate 101 and the gate electrode 103. Here, a conductive layer is formed over the substrate 101 and etched with use of a resist mask formed using a photomask, so that the gate electrode 103 is formed.

Note that side surfaces of the gate electrode 103 are preferably tapered. This is because an insulating layer, a semiconductor layer, and a wiring layer, which are formed over the gate electrode 103 in subsequent steps are not disconnected. In order to form the side surfaces of the gate electrode 103 into a tapered shape, etching may be performed while the resist mask is made to recede.

Through the process of forming the gate electrode 103, a gate wiring (a scanning line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and one of or both a gate wiring and a capacitor wiring may be formed separately.

The gate insulating layer 105 can be formed by a CVD method, a sputtering method, or the like using the material given in Embodiment 1. In a process of forming the gate insulating layer 105 by a CVD method, glow discharge plasma is generated by applying high-frequency power with a frequency of 3 MHz to 30 MHz, typically 13.56 MHz or 27.12 MHz, or high-frequency power in the VHF band with a frequency of 30 MHz to about 300 MHz, typically 60 MHz. Alternatively, glow discharge plasma is generated by applying high frequency power at a microwave frequency of 1 GHz or higher. With the use of high-frequency power in the VHF band or with a microwave frequency, the deposition rate can be increased. Note that the high-frequency power can be applied in a pulsed manner or a continuous manner. In addition, by superimposing high-frequency power in the HF band and high-frequency power in the VHF band on each other, unevenness of plasma in a large-sized substrate is also reduced, so that uniformity can be improved and the deposition rate can be increased. When the gate insulating layer 105 is formed at a high frequency (1 GHz or higher) using a microwave plasma CVD apparatus, the dielectric strength between the gate electrode and the drain and source electrodes can be improved, so that a highly reliable thin film transistor can be obtained.

Further, when a silicon oxide layer is formed as the gate insulating layer 105 by a CVD method using an organosilane gas, the crystallinity of the semiconductor layer which is formed later can be improved, so that the on current and field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The microcrystalline semiconductor layer 107 is formed using a microcrystalline semiconductor layer typified by a microcrystalline silicon layer, a microcrystalline silicon-germanium layer, a microcrystalline germanium layer, or the like. It is preferable for the microcrystalline semiconductor layer 107 to have a thickness of 3 nm to 100 nm, and much preferable to have a thickness of 5 nm to 50 nm. In the case where the microcrystalline semiconductor layer 107 is too thin, the on current of the thin film transistor is reduced. In the case where the microcrystalline semiconductor layer 107 is too thick, the off current of the thin film transistor is increased when the thin film transistor operates at a high temperature. The thickness of the microcrystalline semiconductor layer 107 is set to 3 nm to 100 nm, preferably, 5 nm to 50 nm, whereby the on current and the off current of the thin film transistor can be controlled.

In a reaction chamber of the plasma CVD apparatus, the microcrystalline semiconductor layer 107 is formed by glow discharge plasma with use of a mixed gas which includes hydrogen and a deposition gas containing silicon or germanium. Alternatively, the microcrystalline semiconductor layer 107 is formed by glow discharge plasma with a mixture of a deposition gas containing silicon or germanium, hydrogen, and a rare gas such as helium, neon, or krypton. Microcrystalline silicon, microcrystalline silicon-germanium, microcrystalline germanium, or the like is formed using a mixture which is obtained by diluting the deposition gas containing silicon or germanium with hydrogen whose flow rate is 10 to 2000 times, preferably 10 to 200 times that of the deposition gas. The deposition temperature in that case is preferably a room temperature to 300° C., much preferably, 200° C. to 280° C.

As typical examples of the deposition gas containing silicon or germanium, $SiH_4$, $Si_2H_6$, $GeH_4$, and $Ge_2H_6$ are given.

In the case where the gate insulating layer 105 is formed using a silicon nitride layer, at an early stage of deposition of the microcrystalline semiconductor layer 107, an amorphous semiconductor region is likely to be formed. In such a case, crystallinity of the microcrystalline semiconductor layer 107 is low and electric characteristics of the thin film transistor are poor. Therefore, when the gate insulating layer 105 is formed using a silicon nitride layer, the microcrystalline semiconductor layer 107 is preferably deposited under the condition that the dilution rate of the deposition gas containing silicon or germanium is high or under the low temperature condition. Typically, the high dilution rate condition in which the flow rate of hydrogen is 200 to 2000 times, more preferably 250 to 400 times that of the deposition gas containing silicon or germanium is preferable. In addition, the low temperature condition in which the temperature for deposition of the microcrystalline semiconductor layer 107 is 200° C. to 250° C. is preferable. When the high dilution rate condition or the low temperature condition is employed, initial nucleation density is increased, an amorphous component over the gate insulating layer 105 is reduced, and crystallinity of the microcrystalline semiconductor layer 107 is improved. Furthermore, when the surface of the gate insulating layer 105 formed using a silicon nitride layer is oxidized, the adhesion with the microcrystalline semiconductor layer 107 is improved. As the oxidation treatment, exposure to an oxidizing gas, plasma treatment in an oxidation gas, or the like can be given.

A rare gas such as helium, argon, neon, krypton, or xenon is used as a source gas for the microcrystalline semiconductor layer 107, whereby the deposition rate of the microcrystalline semiconductor layer 107 can be increased. Moreover, since the deposition rate is increased, the amount of impurities entered in the microcrystalline semiconductor layer 107 is reduced; thus, the crystallinity of the microcrystalline semiconductor layer 107 can be improved. Accordingly, the on current and field-effect mobility of the thin film transistor are increased and throughput of the thin film transistor can also be increased.

When the microcrystalline semiconductor layer 107 is formed, glow discharge plasma is generated by applying high frequency power of 3 MHz to 30 MHz, typically, high frequency power of 13.56 MHz or 27.12 MHz in the HF band, or high frequency power of approximately 30 MHz to 300 MHz in the VHF band, typically 60 MHz. Alternatively, glow discharge plasma is generated by applying high frequency power at a microwave frequency of 1 GHz or higher. Note that the high-frequency power can be applied in a pulsed manner or a continuous manner. In addition, by superimposing high-frequency power in the HF band and high-frequency power in the VHF band on each other, unevenness of plasma in a large-sized substrate is also reduced, so that uniformity can be improved and the deposition rate can be increased.

Note that while a low-mass impurity element such as nitrogen or oxygen is removed by evacuation of a treatment chamber of a CVD apparatus, deposition is conducted by introducing a deposition gas containing silicon or germanium for formation of the microcrystalline semiconductor layer 107. In the above manner, the amount of impurities in the microcrystalline semiconductor layer 107 can be reduced. As a result, electric characteristics of the thin film transistor can be increased. Further, before the microcrystalline semiconductor layer 107 is formed, plasma is generated in an atmosphere containing fluorine such as a fluorine atmosphere, a nitrogen fluoride atmosphere, or a silane fluoride atmosphere, and the gate insulating layer 105 is exposed to the fluorine plasma, whereby the dense microcrystalline semiconductor layer 107 can be formed.

Figure 10B:
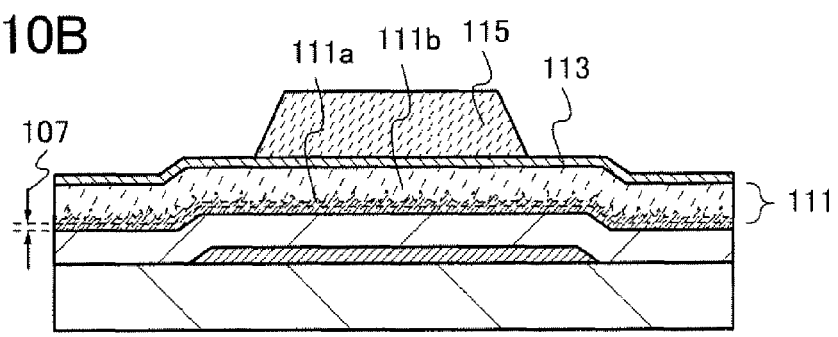

Next, as illustrated in FIG. 10B, a semiconductor layer 111 is formed over the microcrystalline semiconductor layer 107. The semiconductor layer 111 includes a microcrystalline semiconductor region 111a and an amorphous semiconductor region 111b. Next, an impurity semiconductor layer 113 is formed over the semiconductor layer 111. Then, a resist mask 115 is formed over the impurity semiconductor layer 113.

The semiconductor layer 111 including the microcrystalline semiconductor region 111a and the amorphous semiconductor region 111b can be formed under such a condition that crystal growth is partly conducted (the crystal grow is reduced) with use of the microcrystalline semiconductor layer 107 as a seed crystal.

In the treatment chamber of the plasma CVD apparatus, the semiconductor layer 111 is formed by glow discharge plasma with use of a mixed gas which includes a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the microcrystalline semiconductor layer 107.

In this case, a flow ratio of the deposition gas containing silicon or germanium to hydrogen is the same as that for forming a microcrystalline semiconductor layer 107, and a gas containing nitrogen is used for the source gas, whereby crystal growth can be reduced as compared to the deposition condition of the microcrystalline semiconductor layer 107. Specifically, since a gas containing nitrogen is included in the source gas, the crystal growth is partly reduced at an early stage of deposition of the semiconductor layer 111; therefore, a conical or pyramidal microcrystalline semiconductor region grows, and an amorphous semiconductor region is formed. Furthermore, in the middle stage or later stage of deposition, the crystal growth of the conical or pyramidal microcrystalline semiconductor region is stopped, and only the amorphous semiconductor region is deposited. As a result, in the semiconductor layer 111, the microcrystalline semiconductor region 111a and the amorphous semiconductor region 111b which is formed using a well-ordered semiconductor layer having fewer defects and a steep tail of a level at a band edge in the valence band, can be formed.

Here, a typical example of a condition for forming the semiconductor layer 111 is as follows. The flow rate of hydrogen is 10 to 2000 times, preferably, 10 to 200 times that of the deposition gas containing silicon or germanium. Note that in a typical example of a normal condition for forming an amorphous semiconductor layer, the flow rate of hydrogen is 0 to 5 times that of the deposition gas containing silicon or germanium.

A rare gas such as helium, neon, argon, krypton, or xenon is introduced into the source gas of the semiconductor layer 111, whereby the deposition rate of the semiconductor layer 111 can be increased.

It is preferable for the semiconductor layer 111 to have a thickness of 50 nm to 350 nm, and further preferable to have a thickness of 120 nm to 250 nm.

Here, the semiconductor layer 111 including the microcrystalline semiconductor region 111a and the amorphous semiconductor region 111b is formed with use of a source gas of the semiconductor layer 111, which includes a gas containing nitrogen. Alternatively, the semiconductor layer 111 is formed with use of a source gas which includes hydrogen and a deposition gas containing silicon or germanium after nitrogen is adsorbed on the surface of the microcrystalline semiconductor layer 107 by exposing the surface of the microcrystalline semiconductor layer 107 to a gas containing nitrogen. Accordingly, the semiconductor layer 111 including the microcrystalline semiconductor region 111a and the amorphous semiconductor region 111b can be formed.

The impurity semiconductor layer 113 is formed by glow discharge plasma with a mixture of a deposition gas containing silicon, hydrogen, and phosphine (diluted with hydrogen or silane) in the reactive chamber of the plasma CVD apparatus. Amorphous silicon to which phosphorus is added or microcrystalline silicon to which phosphorus is added is formed by diluting the deposition gas containing silicon with hydrogen. In the case of manufacturing a p-channel thin film transistor, the impurity semiconductor layer 113 may be formed by glow discharge plasma using diborane instead of phosphine.

The resist mask 115 can be formed by a photolithography step.

Next, with use of the resist mask 115, the microcrystalline semiconductor layer 107, the semiconductor layer 111, and the impurity semiconductor layer 113 are etched. Through this step, the microcrystalline semiconductor layer 107, the semiconductor layer 111, and the impurity semiconductor layer 113 are divided for each element to form a semiconductor layer 117 and an impurity semiconductor layer 121. Note that the semiconductor layer 117 is part of the microcrystalline semiconductor layer 107 and the semiconductor layer 111 and includes a microcrystalline semiconductor region 117a and an amorphous semiconductor region 117b.

Figure 10C:
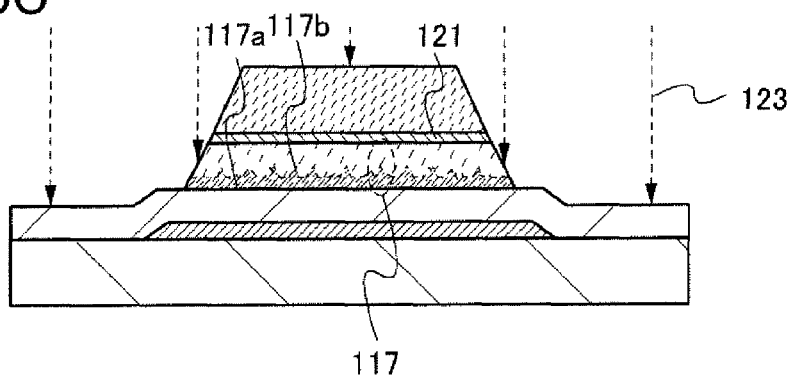
Figure 10D:
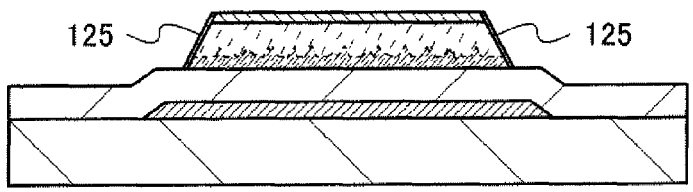

Then, plasma treatment is performed in the state where the resist mask 115 is left so that the side surfaces of the semiconductor layer 117 are exposed to plasma 123 (see FIG. 10C). Here, plasma is generated in an oxidation gas or nitriding gas atmosphere, and the semiconductor layer 117 is exposed to the plasma 123. Examples of the oxidation gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Generation of plasma in an oxidation gas or a nitriding gas causes an oxygen radical or a nitrogen radical to be generated. The radical reacts with the semiconductor layer 117, which forms the insulating region 125 functioning as a barrier region on the side surfaces of the semiconductor layer 117 (see FIG. 10D). Note that instead of irradiation with plasma, irradiation with ultraviolet light may be employed for generation of an oxygen radical or a nitrogen radical.

Figure 11A:
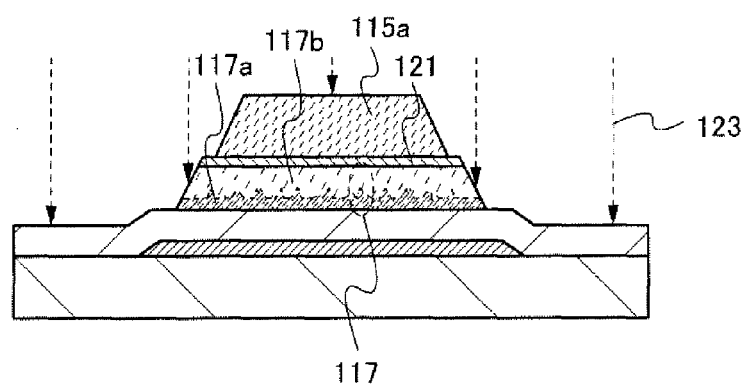
FIGS. 11A and 11B are cross-sectional views illustrating a method for manufacturing a thin film transistor according to one embodiment of the present invention.
Figure 11B:
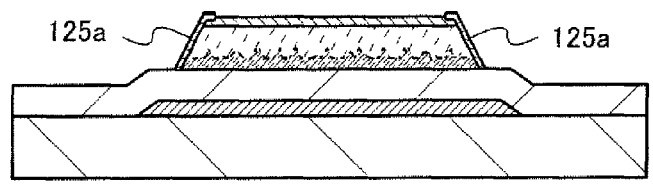

In the case of using oxygen, ozone, water vapor, or a mixed gas of oxygen and hydrogen as the oxidation gas, the resist recedes by plasma irradiation, and a resist mask 115a which is smaller than the resist mask 115 is formed as illustrated in FIG. 11A. Therefore, by the plasma treatment, the exposed impurity semiconductor layer 121 is oxidized together with the side wall of the semiconductor layer 117. Accordingly, the insulating region 125a functioning as a barrier region is formed on the side wall and part of the top surface of the impurity semiconductor layer 121 and the side wall of the semiconductor layer 117, as illustrated in FIG. 11B.

Figure 12A:
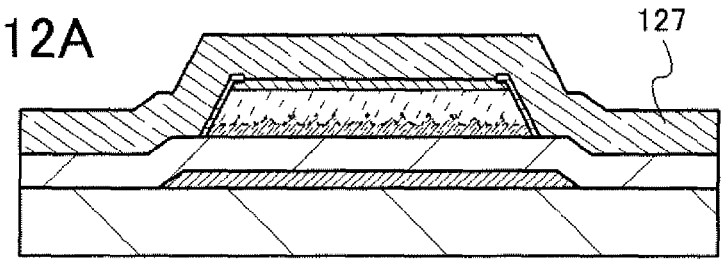
FIGS. 12A to 12D are cross-sectional views illustrating a method for manufacturing a thin film transistor according to one embodiment of the present invention.

Next, a conductive layer 127 is formed over the impurity semiconductor layer 121 and the insulating region 125a (see FIG. 12A). The conducive layer 127 can be formed using a material similar to that of the wirings 129a and 129b described in Embodiment 1 as appropriate. The conductive layer 127 is formed by a CVD method, a sputtering method, or a vacuum evaporation method. Alternatively, the conductive layer 127 may be formed by discharging a conductive nanopaste of silver, gold, copper, or the like by a screen printing method, an ink-jet method, or the like and baking the conductive nanopaste.

Figure 12B:
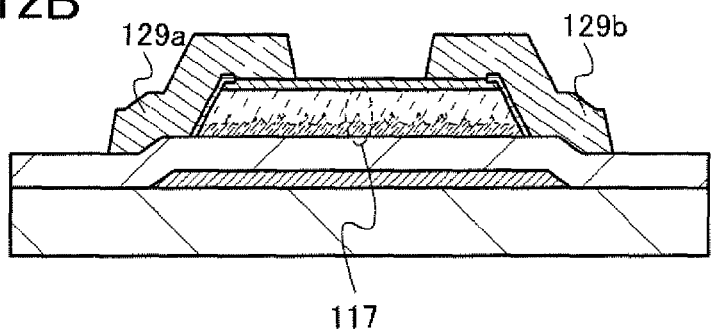
Figure 12C:
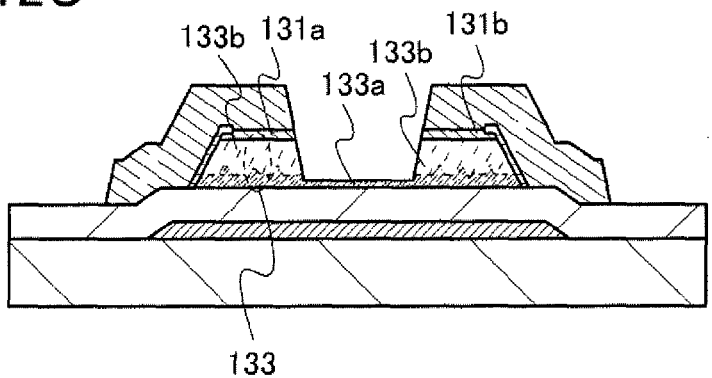
Figure 12D:
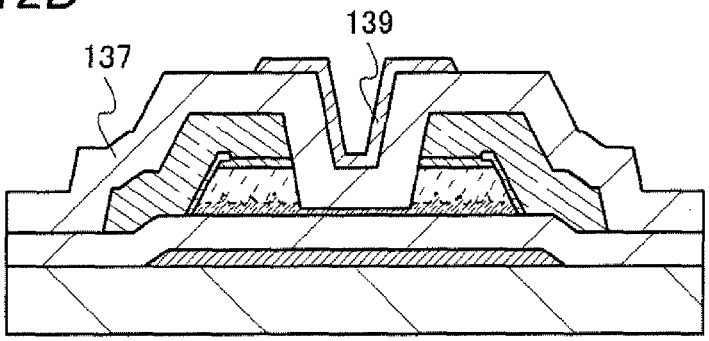

Then, a resist mask is formed by a photolithography step, and the conductive layer 127 is etched with use of the resist mask, so that the wirings 129a and 129b functioning as a source electrode and a drain electrode are formed (see FIG. 12B). The etching of the conductive layer 127 may be either dry etching or wet etching. Note that one of the wirings 129a and 129b functions as a signal line as well as a source electrode or a drain electrode. However, without limitation thereto, a signal line may be provided independently in addition to the source and drain electrodes.

Next, the impurity semiconductor layer 121 and the semiconductor layer 117 are partly etched, so that a pair of the impurity semiconductor layers 131a and 131b functioning as a source and drain regions are formed. Also, the semiconductor layer 133 including the microcrystalline semiconductor region 133a and the pair of amorphous semiconductor regions 133b is formed. At this point, etching of the semiconductor layer 117 is performed so that the microcrystalline semiconductor region 133a is exposed, whereby the semiconductor layer 133 has the following structure. In regions which are covered with the wirings 129a and 129b, the microcrystalline semiconductor region 133a and the amorphous semiconductor region 133b are stacked, and in a region which is not covered with the wirings 129a and 129b but overlaps with the gate electrode 103, the microcrystalline semiconductor region 133a is exposed (see FIG. 12C).

Since dry etching is used in the etching step here, the ends of the wirings 129a and 129b are aligned with ends of the impurity semiconductor layers 131a and 131b. If the conductive layer 127 is subjected to wet etching and the impurity semiconductor layer 121 is subjected to dry etching, the ends of the wirings 129a and 129b and the ends of the impurity semiconductor layers 131a and 131b are not aligned. In a cross section in such a case, the ends of the wirings 129a and 129b are positioned on the inner side than the ends of the impurity semiconductor layers 131a and 131b.

Next, dry etching may be performed. The dry etching is performed with a low etching rates of the microcrystalline semiconductor region 133a and the amorphous semiconductor region 133b so that the exposed microcrystalline semiconductor region 133a and the amorphous semiconductor region 133b are not damaged. In other words, the employed condition is that almost no damage is given the surfaces of the exposed microcrystalline semiconductor region 133a and the amorphous semiconductor region 133b and the thicknesses of the exposed microcrystalline semiconductor region 133a and the amorphous semiconductor region 133b are hardly reduced. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used. Note that after the microcrystalline semiconductor region 133a and the amorphous semiconductor region 133b are formed, the dry etching is additionally performed under the condition that no damage is given the microcrystalline semiconductor region 133a and the amorphous semiconductor region 133b, whereby an impurity such as a residual existing over the exposed microcrystalline semiconductor region 133a and the amorphous semiconductor region 133b can be removed.

Next, the surfaces of the microcrystalline semiconductor region 133a and the amorphous semiconductor region 133b may be subjected to plasma treatment, typically, water plasma treatment, oxygen plasma treatment, ammonia plasma treatment, nitrogen plasma treatment, or the like.

Water plasma treatment can be performed in such a manner that a gas containing water typified by water vapor ($H_2O$ vapor) as a main component is introduced into a reaction space so that plasma is generated. Then, the resist mask is removed. Note that the removal of the resist mask may be performed before the dry etching.

After the dry etching, water plasma treatment is successively performed, whereby a residue of the resist mask can also be removed. By the plasma treatment, insulation between the source region and the drain region can be ensured, and thus, in a thin film transistor which is completed, the off current can be reduced, and variation in electric characteristics can be reduced.

Next, the insulating layer 137 is formed. The insulating layer 137 can be formed in a manner similar to that for the gate insulating layer 105.

Figure 22A:
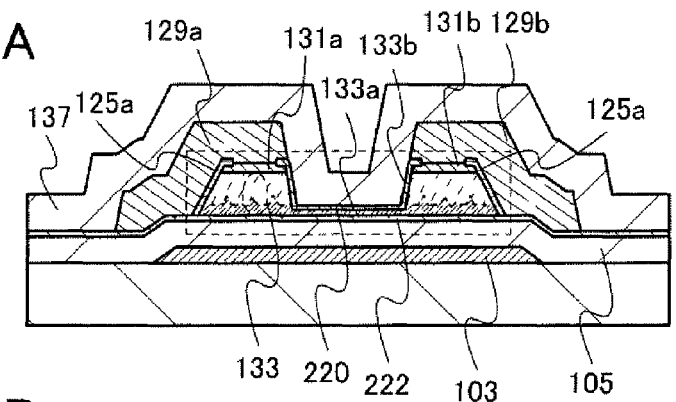
FIGS. 22A to 22D are cross-sectional views illustrating thin film transistors according to one embodiment of the present invention.
Figure 22B:
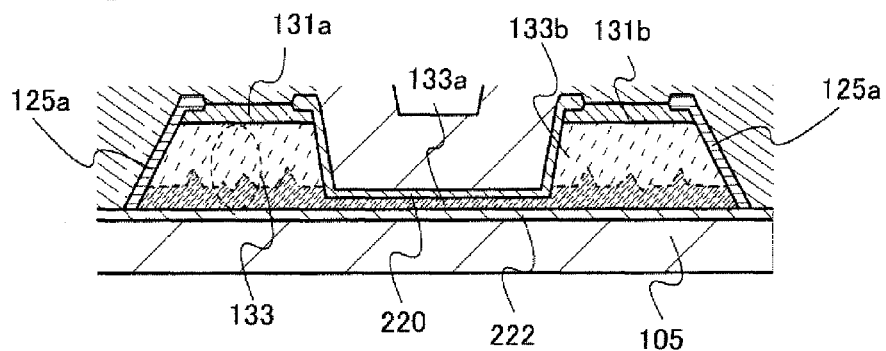

Although not illustrated in FIGS. 12A to 12D, by performance of the water plasma, an insulating region 220 is formed on the channel formation region between the source region and the drain region (see FIG. 22A). There is a description "when the surface of the gate insulating layer 105 formed using a silicon nitride layer is oxidized, the adhesion with the microcrystalline semiconductor layer 107 is improved" in this specification; an insulating region 222 is formed on the surface of the gate insulating layer 105 by oxidation treatment. The top surface, bottom surface, and side surfaces of the semiconductor layer, except a part of the surfaces of the impurity semiconductor layers 131a and 131b functioning as a source region and a drain region, are covered with the insulating regions which are formed using oxide, when the insulating region 125a which is formed using an oxidation gas is included in the above insulating regions in addition to the insulating regions 220 and 222. FIG. 22B is an enlarged view illustrating the portion surrounded by a dotted line in FIG. 22A. Note that when a silicon oxide film is used for the gate insulating layer 105 to function as the oxide insulating region 222, without the oxidation treatment performed on the surface of the gate insulating layer 105, the top surface, bottom surface, and side surfaces of the semiconductor layer, except the part of the surfaces of the impurity semiconductor layers 131a and 131b, are covered with the oxide insulating regions as in the above case.

Through the above steps, a thin film transistor including a channel formation region which is formed using a microcrystalline semiconductor layer, like the thin film transistors illustrated in FIG. 1A and FIG. 2, can be manufactured. Further, a thin film transistor with low off current, high on current, and high field-effect mobility can be manufactured with high productivity.

Next, an opening (not illustrated) is formed in the insulating layer 137 with use of a resist mask formed by a photolithography step. Then, the back-gate electrode 139 is formed (see FIG. 12D).

The back-gate electrode 139 can be formed in the following manner: a thin film is formed using the materials described in Embodiment 1 by a sputtering method; and the thin film is etched using a resist mask that is formed by a photolithography step. Alternatively, the back-gate electrode 139 can be formed by applying or printing a conductive composition including a conductive polymer having a light-transmitting property, and baking the composition.

Through the above steps, the dual-gate thin film transistor as illustrated in FIG. 1B can be manufactured.

Note that this embodiment can be applied to other embodiments.

Embodiment 7

In this embodiment, a method for manufacturing the thin film transistor described in Embodiment 2 will be described with reference to FIGS. 10A and 10B, and FIGS. 13A and 13B.

In a manner similar to that of Embodiment 6, the gate electrode 103, the gate insulating layer 105, the semiconductor layer 117, and the impurity semiconductor layer 121 are formed over the substrate 101 through the steps of FIGS. 10A and 10B.

Figure 13A:
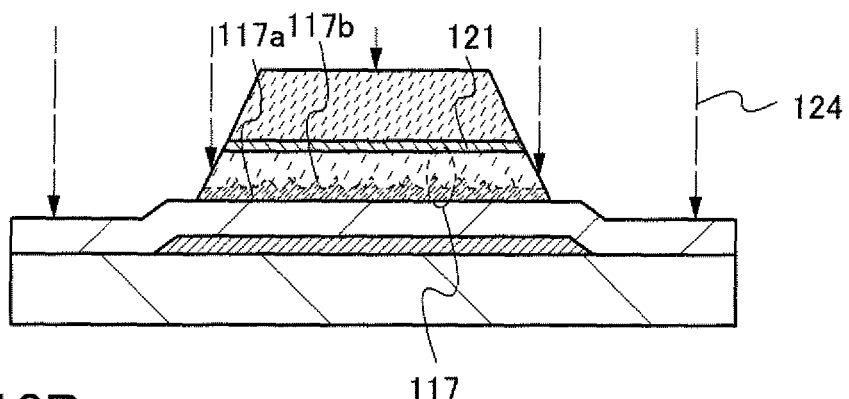
FIGS. 13A and 13B are cross-sectional views illustrating a method for manufacturing a thin film transistor according to one embodiment of the present invention.
Figure 13B:
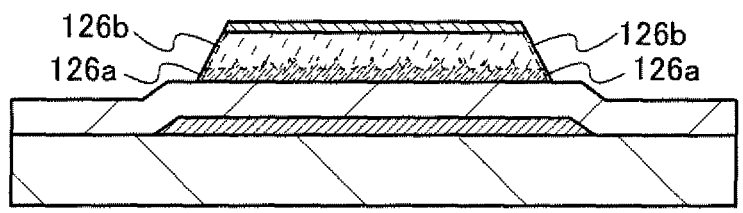
Figure 14:
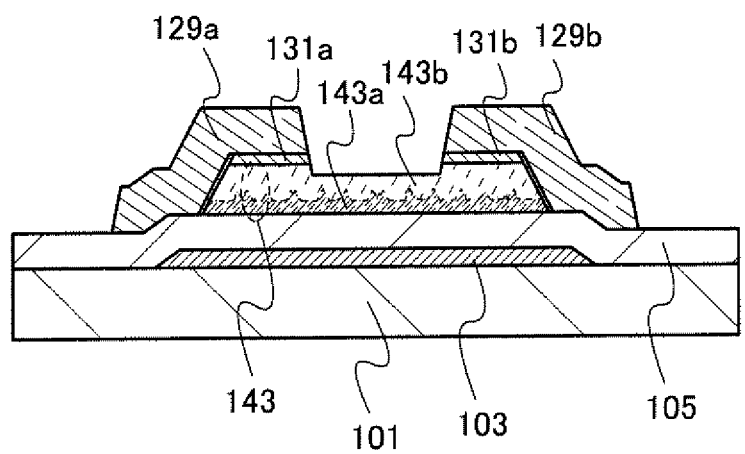
FIG. 14 is a cross-sectional view illustrating a method for manufacturing a thin film transistor according to one embodiment of the present invention.

Next, plasma treatment in which the side surfaces of the semiconductor layer 117 are exposed to plasma 124 is performed (see FIG. 13A). Here, plasma is generated in an atmosphere of a rare gas such as helium, neon, argon, krypton, or xenon, and the semiconductor layer 117 is exposed to the plasma 124. Generation of plasma in a rare gas atmosphere causes a rare-gas radical to be generated. The radical is low reactive radical though it has energy; this radical breaks the bonds in the semiconductor layer 117, which reduces density of the semiconductor layer. In particular, in the microcrystalline semiconductor region 117a, defects are caused by reduction in density, and the microcrystalline semiconductor region 117a is made amorphous partly. Thus, the first amorphous region 126a and the second amorphous region 126b which are barrier regions are formed on the side surfaces of the semiconductor layer 117 (see FIG. 13B).

After that, through the steps similar to those of Embodiment 6 (see FIGS. 12A to 12D), the thin film transistor having high on current, high field-effect mobility, and low off current, which is illustrated in FIGS. 4A to 4C, can be manufactured.

Note that this embodiment can be applied to other embodiments.

Embodiment 8

In this embodiment, a method for manufacturing the thin film transistor described in Embodiment 3 will be described with reference to FIGS. 10A to 10D, FIGS. 11A and 11B, FIGS. 12A to 12D, and FIG. 14.

In a manner similar to that of Embodiment 6, the gate electrode 103, the gate insulating layer 105, the semiconductor layer 117, the impurity semiconductor layer 121, and the insulating region 125 are formed over the substrate 101 through the steps of FIGS. 10A to 10D.

Further, when an oxidation gas such as oxygen, ozone, water vapor, or a mixed gas of oxygen and hydrogen is used in the step illustrated in FIG. 10C, the resist recedes by plasma irradiation, and a resist mask 115a which is smaller than the resist mask 115 is formed as illustrated in FIG. 11A. Therefore, by the plasma treatment, the exposed impurity semiconductor layer 121 is oxidized together with the side wall of the semiconductor layer 117. Accordingly, the insulating region 125a functioning as a barrier region is formed on the side wall and part of the top surface of the impurity semiconductor layer 121 and the side wall of the semiconductor layer 117, as illustrated in FIG. 11B.

Next, after the conductive layer 127 is formed, by performance of a photolithography step and an etching step, wirings 129a and 129b are formed as illustrated in FIG. 12B. Then, the impurity semiconductor layer 121 and the semiconductor layer 117 are partly etched, so that a pair of the impurity semiconductor layers 131a and 131b functioning as a source region and a drain region are formed. Further, the semiconductor layer 143 including the microcrystalline semiconductor region 143a and the amorphous semiconductor region 143b is also formed. At this point, etching of the semiconductor layer 117 is performed in such a manner that the amorphous semiconductor region 143b is exposed but the microcrystalline semiconductor region 143a is not exposed. Accordingly, the semiconductor layer 143 in which one of surfaces of the microcrystalline semiconductor region 143a is in contact with the gate insulating layer 105 and the other surface is in contact with the amorphous semiconductor region 143b is formed.

The surface of the amorphous semiconductor region 143b may be subjected to plasma treatment typified by water plasma treatment, oxygen plasma treatment, ammonia plasma treatment, nitrogen plasma treatment, or the like.

Water plasma treatment can be performed in such a manner that a gas containing water typified by water vapor ($H_2O$ vapor) as a main component is introduced into a reaction space so that plasma is generated. After that, the resist mask used for formation of the semiconductor layer 143, the wirings 129a and 129b, and the impurity semiconductor layers 131a and 131b is removed. Note that removal of the resist mask may be performed before the dry etching for formation of the semiconductor layer 143.

As described above, after formation of the amorphous semiconductor region 143b, dry etching is additionally performed under a condition that no damages is given the amorphous semiconductor region 143b, whereby an impurity such as a residue existing on the exposed surface of the amorphous semiconductor region 143b can be removed. Further, after the dry etching, water plasma treatment is successively performed, whereby a residue of the resist mask can also be removed. By the plasma treatment, insulation between the source region and the drain region can be ensured, and thus, in a thin film transistor which is completed, the off current can be reduced, and variation in electric characteristics can be reduced.

Figure 22C:
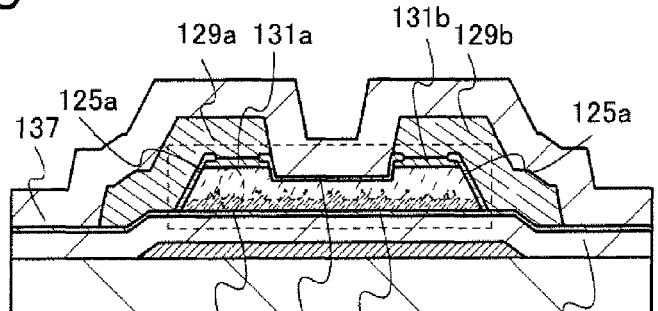
Figure 22D:
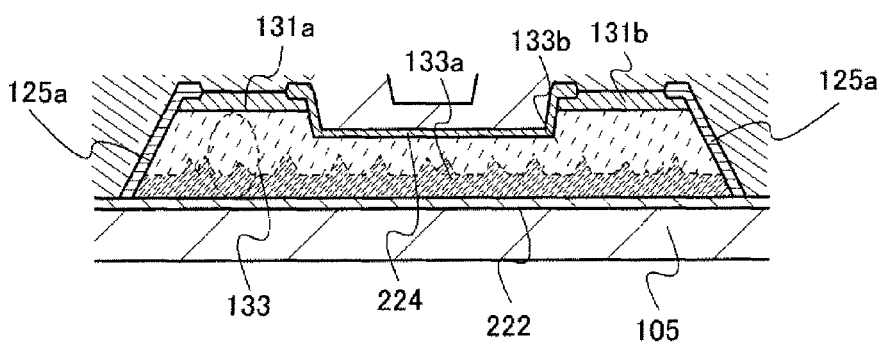

By performance of the water plasma treatment, an insulating region 224 is formed on a channel formation region between the source region and the drain region (see FIG. 22C). There is a description "when the surface of the gate insulating layer 105 formed using a silicon nitride layer is oxidized, the adhesion with the microcrystalline semiconductor layer 107 is improved" in this specification; the insulating region 222 is formed on the surface of the gate insulating layer 105 by oxidation treatment. The top surface, bottom surface, and side surfaces of the semiconductor layer, except a part of the surfaces of the impurity semiconductor layers 131a and 131b functioning as a source region and a drain region, are covered with the insulating regions which are formed using oxide, when the insulating region 125a which is formed using an oxidation gas is included in the above insulating regions in addition to the insulating regions 224 and 222. FIG. 22D is an enlarged view illustrating the portion surrounded by a dotted line in FIG. 22C. Note that when a silicon oxide film is used for the gate insulating layer 105 to function as the oxide insulating region 222, without the oxidation treatment performed on the surface of the gate insulating layer 105, the top surface, bottom surface, and side surfaces of the semiconductor layer, except the part of the surfaces of the impurity semiconductor layers 131a and 131b, are covered with the oxide insulating regions as in the above case.

Through the above steps, the thin film transistor having high on current, high field-effect mobility, and low off current, which is illustrated in FIG. 6A and FIG. 7 can be manufactured.

After that, by formation of the insulating layer 137 and the back-gate electrode 139, the thin film transistor having high on current, high field-effect mobility, and low off current, which is illustrated in FIG. 6B can be manufactured.

Note that this embodiment can be applied to other embodiments.

Embodiment 9

In this embodiment, a method for manufacturing the thin film transistor described in Embodiment 4 will be described with reference to FIGS. 10A and 10B, FIGS. 12A and 12B, and FIGS. 13A and 13B.

In a manner similar to that of Embodiment 6, the gate electrode 103, the gate insulating layer 105, the semiconductor layer 117, and the impurity semiconductor layer 121 are formed over the substrate 101 through the steps of FIGS. 10A and 10B.

Next, plasma treatment in which the side surfaces of the semiconductor layer 117 are exposed to the plasma 124 is performed (see FIG. 13A). Here, plasma is generated in an atmosphere of a rare gas such as helium, neon, argon, krypton, or xenon, and the semiconductor layer 117 is exposed to the plasma 124. Generation of plasma in a rare gas atmosphere causes a rare-gas radical to be generated. The radical is low reactive radical though it has energy; this radical breaks the bonds in the semiconductor layer 117, which reduces density of the semiconductor layer. In particular, in the microcrystalline semiconductor region 117a, defects are caused by reduction in density, and the microcrystalline semiconductor region 117a is made amorphous. Thus, the first amorphous region 126a and the second amorphous region 126b which are barrier regions are formed on the side surfaces of the semiconductor layer 117 (see FIG. 13B).

After that, through the steps similar to those of Embodiment 8 (see FIGS. 12A and 12B, and FIG. 14), the thin film transistor having low off current, which is illustrated in FIGS. 8A to 8C, can be manufactured.

Note that this embodiment can be applied to other embodiments.

Embodiment 10

In this embodiment, a method for manufacturing the thin film transistor described in Embodiment 5 will be described with reference to FIGS. 10A to 10D and FIG. 13A.

In a manner similar to that of Embodiment 6, the gate electrode 103, the gate insulating layer 105, the semiconductor layer 117, and the impurity semiconductor layer 121 are formed over the substrate 101 through the steps of FIGS. 10A and 101B. Then, the semiconductor layer 117 is irradiated with the plasma 123 (FIG. 10C), so that the insulating region 125 is formed on the side walls of the semiconductor layer 117 (see FIG. 10D).

Next, as illustrated in FIG. 13A, irradiation with the plasma 124 is performed, so that the first amorphous region 126a and the second amorphous region 126b are formed on the semiconductor layer 117.

Note that the irradiation with the plasma 123 illustrated in FIG. 10C may be performed after the irradiation with the plasma 124 illustrated in FIG. 13A.

After that, through the steps similar to those of Embodiment 6 (see FIGS. 12A to 12D), the thin film transistor having low off current, which is illustrated in FIG. 9, can be manufactured.

Embodiment 11

A thin film transistor is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one mode before the display element is completed in a manufacturing process of the display device, is provided with a means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Embodiment 12

A semiconductor device disclosed in this specification can be applied to electronic paper. An electronic paper can be used for electronic devices of a variety of fields as long as they can display data. For example, electronic paper can be applied to an electronic book (e-book) reader, a poster, an advertisement in a vehicle such as a train, a digital signage, a public information display (PID), displays of various cards such as a credit card, and the like. An example of the electronic device is illustrated in FIG. 19.

Figure 19:
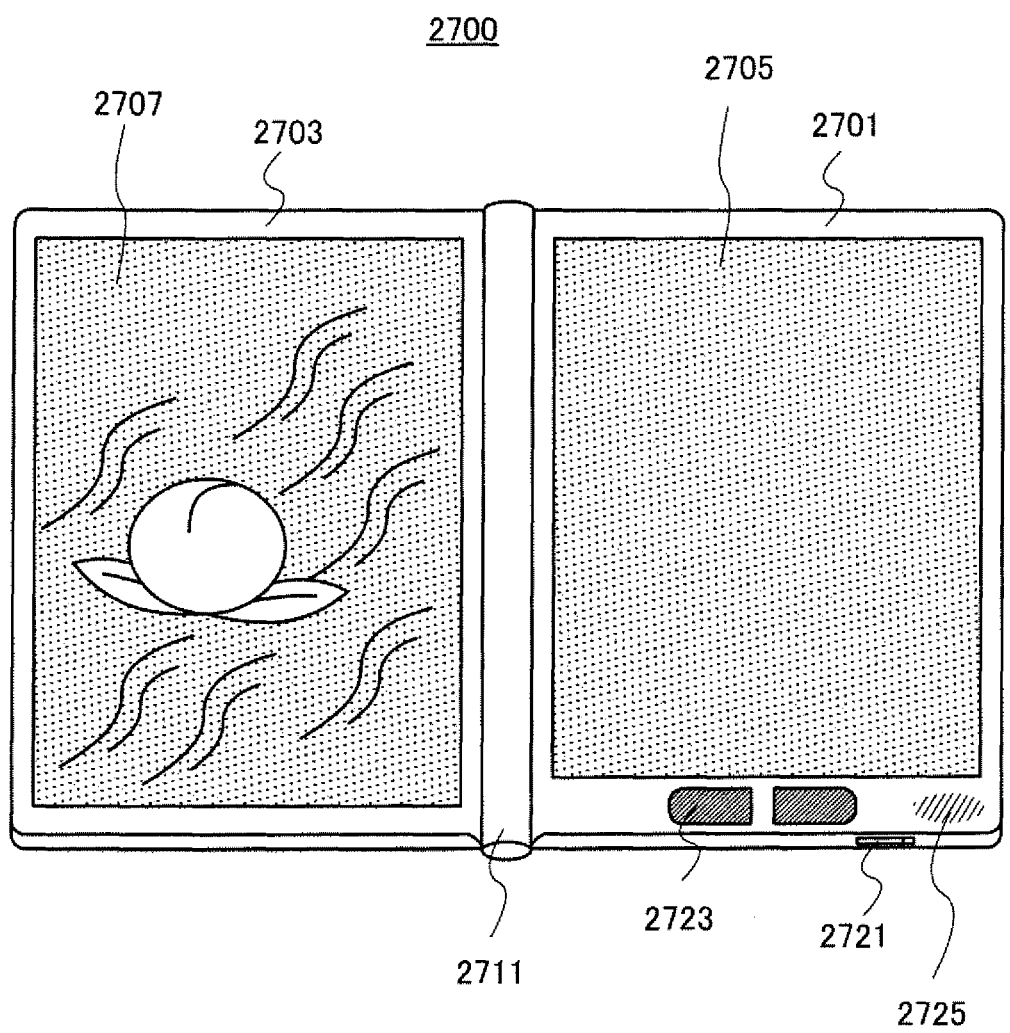
FIG. 19 is an external view illustrating an example of an electronic book reader.

FIG. 19 illustrates an electronic book reader 2700 as an example in which an electronic paper is used. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 19) and graphics can be displayed on a display portion on the left side (the display portion 2707 in FIG. 19).

FIG. 19 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 13

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 20A:
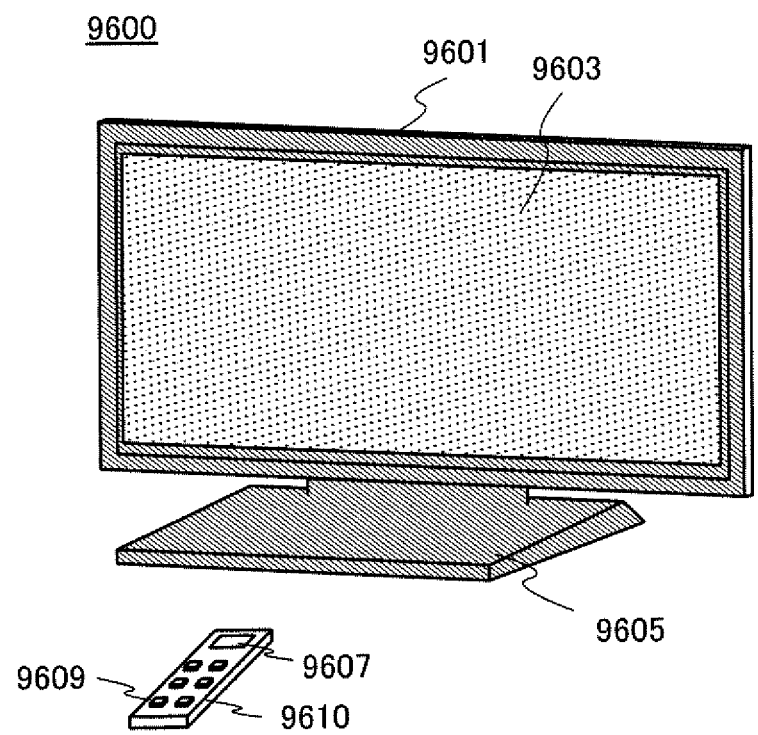
FIGS. 20A and 20B are external views illustrating examples of a television set and a digital photo frame, respectively.

FIG. 20A illustrates a television set 9600 as an example of an electronic device. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 20B:
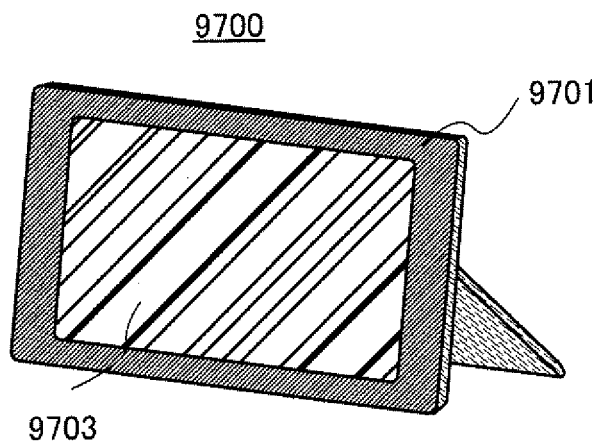

FIG. 20B illustrates a digital photo frame 9700 as an example of an electronic device. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure in which desired image data is transferred wirelessly to be displayed may be employed.

Figure 21:
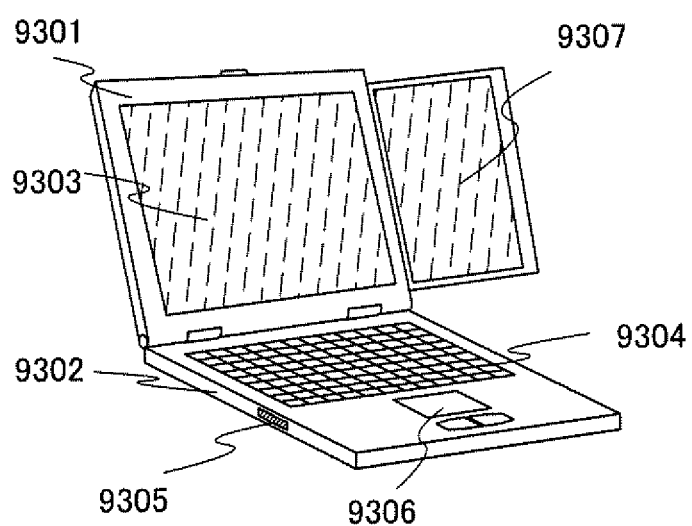
FIG. 21 is a perspective view illustrating an example of a portable computer.

FIG. 21 is a perspective view illustrating an example of a portable computer.

In the portable computer of FIG. 21, a top housing 9301 having a display portion 9303 and a bottom housing 9302 having a keyboard 9304 can overlap with each other by closing a hinge unit which connects the top housing 9301 and the bottom housing 9302. The portable computer of FIG. 21 is convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer illustrated in FIG. 21 can be provided with a receiver and the like and can receive a TV broadcast to display an image on the display portion. The user can watch television broadcast when the whole screen of the display portion 9307 is exposed by sliding the display portion 9307 and the angle of the screen is adjusted while the hinge unit which connects the top housing 9301 and the bottom housing 9302 is kept closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Example 1

In this example, described will be variation in electric characteristics of the single-gate thin film transistor illustrated in FIG. 6A, which is the thin film transistor described in Embodiment 3.

First, a manufacturing process of the thin film transistor will be described with reference to FIGS. 15A to 15D.

An insulating layer 302 was formed over a substrate 301, and a gate electrode 303 was formed over the insulating layer 302.

Here, a glass substrate (EAGLE XG manufactured by Corning Incorporated) was used as the substrate 301.

A titanium layer with a thickness of 50 nm was formed over the insulating layer 302 by sputtering a titanium target with use of argon ions at a flow rate of 20 sccm. Then, an aluminum layer with a thickness of 380 nm was formed thereover by sputtering an aluminum target with use of argon ions at a flow rate of 50 sccm. Then, a titanium layer with a thickness of 120 nm was formed thereover by sputtering a titanium target with use of argon ions at a flow rate of 20 sccm. Next, after the titanium layer was coated with a resist, exposure was performed using a first photomask. After that, development was performed, so that a resist mask was formed.

Next, etching was performed using the resist mask, so that the gate electrode 303 was formed. Here, with use of an inductively coupled plasma (ICP) apparatus, a first etching treatment was performed under conditions that the ICP power was 600 W, the bias power was 250 W, the pressure was 1.2 Pa, and an etching gas included boron trichloride at a flow rate of 60 sccm and chlorine at a flow rate of 20 sccm. Then, a second etching treatment was performed under conditions that the ICP power was 500 W, the bias power was 50 W, the pressure was 2.0 Pa, and an etching gas included carbon fluoride at a flow rate of 80 sccm.

After that, the resist mask was removed.

Next, a gate insulating layer 305 and a microcrystalline semiconductor layer 307 were formed over the gate electrode 303 and the gate insulating layer 302.

Here, as the gate insulating layer 305, a silicon nitride layer with a thickness of 110 nm and a silicon oxynitride layer with a thickness of 110 nm were formed.

The silicon nitride layer was formed by a plasma CVD method in which plasma discharge was performed using an RF power source frequency of 13.56 MHz and power of an RF power source of 370 W, under the deposition conditions as follows: silane, hydrogen, nitrogen, and ammonia were introduced as source gases at flow rates of 40 sccm, 500 sccm, 550 sccm, and 140 sccm, respectively, and were stabilized; the pressure of a treatment chamber was set to 100 Pa; and the substrate temperature was set to 280° C.

The silicon oxynitride layer was formed by a plasma CVD method in which plasma discharge was performed using an RF power source frequency of 13.56 MHz and power of an RF power source of 30 W, under the deposition conditions as follows: silane and nitrous oxide were introduced as source gases at flow rates of 5 sccm and 300 sccm, respectively, and were stabilized; the pressure of a treatment chamber was set to 25 Pa; and the substrate temperature was set to 280° C.

Next, after the substrate was taken out from the treatment chamber, the inside of the treatment chamber was cleaned, and an amorphous silicon layer was deposited as a protective layer in the treatment chamber. Then, the substrate was transferred into the treatment chamber, and a 30-nm-thick microcrystalline semiconductor layer 307 was formed.

Figure 15A:
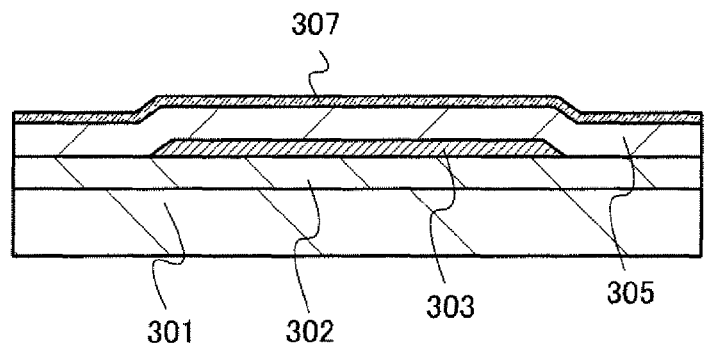
FIGS. 15A to 15D are cross-sectional views illustrating a method for manufacturing a thin film transistor according to one embodiment of the present invention.

The microcrystalline semiconductor layer 307 was formed by a plasma CVD method in which plasma discharge was performed using an RF power source frequency of 13.56 MHz and power of an RF power source of 50 W, under the deposition conditions as follows: silane, hydrogen, and argon were introduced as source gases at the flow rates of 10 sccm, 1500 sccm, and 1500 sccm, respectively, and were stabilized; the pressure of a treatment chamber was set to 280 Pa; and the substrate temperature was set to 280° C. The structure provided through the steps up to here is illustrated in FIG. 15A.

Next, a semiconductor layer 311 was formed over the microcrystalline semiconductor layer 307, and an impurity semiconductor layer 313 was formed over the semiconductor layer 311.

The semiconductor layer 311 was formed by a plasma CVD method in which plasma discharge was performed using an RF power source frequency of 13.56 MHz and power of an RF power source of 100 W, under the deposition conditions as follows: silane, 1000 ppm ammonia (diluted with hydrogen), hydrogen, and argon were introduced as source gases at flow rates of 40 sccm, 125 sccm, 1375 sccm, and 2000 sccm, respectively, and were stabilized; the pressure of a treatment chamber was set to 280 Pa; and the substrate temperature was set to 280° C.

As the impurity semiconductor layer 313, an amorphous silicon layer to which phosphorus was added was formed to a thickness of 50 nm. The impurity semiconductor layer 313 was formed by a plasma CVD method in which plasma discharge was performed using an RF power source frequency of 13.56 MHz and power of an RF power source of 60 W, under the deposition conditions as follows: the flow rates of silane and 0.5% phosphine (diluted with hydrogen) were 100 sccm and 170 sccm, respectively; the deposition temperature was set to 280° C.; and the pressure was set to 170 Pa.

Next, the impurity semiconductor layer 313 was coated with a resist, and exposure to light using a second photomask and development were performed, so that a resist mask 315 was formed.

Figure 15B:
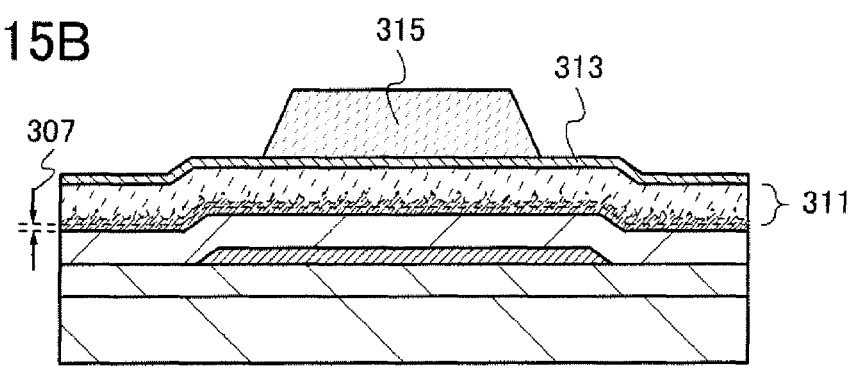

The structure provided through the steps up to here is illustrated in FIG. 15B.

With use of the resist mask, the microcrystalline semiconductor layer 307, the semiconductor layer 311, and the impurity semiconductor layer 313 were etched, so that a semiconductor layer 317 including a microcrystalline semiconductor region 317*a* and an amorphous semiconductor region 317*b* and an impurity semiconductor layer 319 were formed.

Here, three samples were formed. As for Sample 1, with use of an ICP apparatus, etching was performed under the etching conditions as follows: the source power was set to 1000 W, the bias power was set to 80 W, the pressure was set to 1.51 Pa, and chlorine was used as an etching gas at a flow rate of 1000 sccm. In each of Sample 2 and Sample 3, with use of an ICP apparatus, etching was performed under the etching conditions as follows: the ICP power was set to 450 W, the bias power was set to 100 W, the pressure was set to 2.0 Pa, and boron trichloride, carbon fluoride, and oxygen were used as etching gases at the flow rates of 36 sccm, 36 sccm, and 8 sccm, respectively.

Figure 15C:
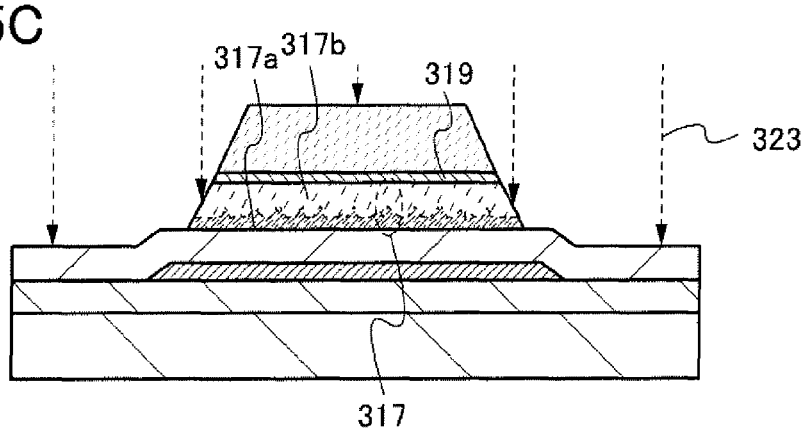

Next, Sample 2 and Sample 3 were each subjected to plasma treatment in which side surfaces of the semiconductor layer 317 were exposed to plasma 323 on the condition that the resist mask 315 was left (see FIG. 15C).

On Sample 2, with use of the ICP apparatus, plasma treatment was performed in an oxygen atmosphere at a flow rate of 100 sccm under the conditions that the ICP power was set to 2000 W, the bias power was set to 350 W, and the pressure was set to 0.67 Pa, so that an insulating region (here, a silicon oxide region) was formed as a barrier region 325. On Sample 3, with use of the ICP apparatus, plasma treatment was performed in an argon atmosphere at a flow rate of 300 sccm under the conditions that the ICP power was set to 2000 W, the bias power was set to 350 W, and the pressure was set to 0.67 Pa, so that an insulating region (here, an amorphous silicon region) was formed as the barrier region 325.

Figure 15D:
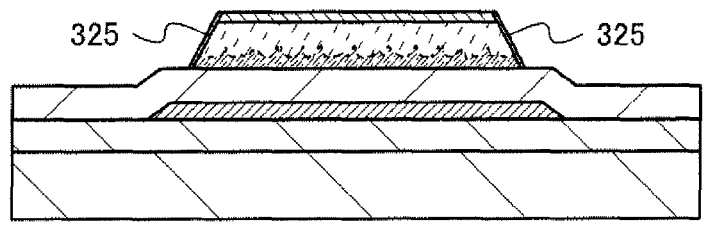

Then, the resist mask was removed (see FIG. 15D).

Figure 16A:
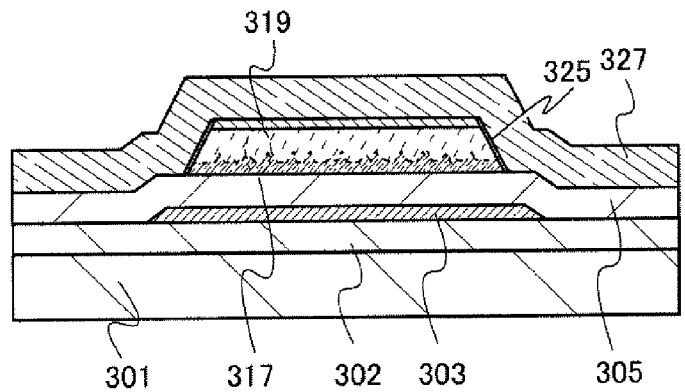
FIGS. 16A to 16C are cross-sectional views illustrating a method for manufacturing a thin film transistor according to one embodiment of the present invention.

Next, as illustrated in FIG. 16A, a conductive layer 327 was formed to cover the gate insulating layer 305, the semiconductor layer 317, and the impurity semiconductor layer 319. Here, a titanium layer with a thickness of 50 nm was formed by sputtering a titanium target with use of argon ions at a flow rate of 20 sccm, and an aluminum layer with a thickness of 200 nm was formed thereover by sputtering an aluminum target with use of argon ions at a flow rate of 50 sccm. Then, a titanium layer with a thickness of 50 nm was formed thereover by sputtering a titanium target with use of argon ions at a flow rate of 20 sccm.

Next, after the conductive layer 327 was coated with a resist, exposure was performed using a third photomask. After that, development was performed, so that a resist mask was formed. With use of the resist mask, dry etching was performed. In this etching, the conductive layer 327 was etched, so that a wiring 329 was formed, and the impurity semiconductor layer 319 was etched, so that source and drain regions 330 were formed. Further, the semiconductor layer 317 was partly etched.

Here, the etching conditions were as follows: the ICP power was 450 W; the bias power was 100 W; the pressure was 1.9 Pa; and the etching gases included boron trichloride at a flow rate of 60 sccm and chlorine at a flow rate of 20 sccm. The semiconductor layer 317 was etched to have a concave portion whose height was 20 nm to 40 nm. As a result, the thickness of the region in the semiconductor layer 317 which does not overlap with the wiring 329 was 165 nm to 185 nm. Note that in this example, the planar shape of the wiring 329 functioning as the source electrode and drain electrode is linear.

Figure 16B:
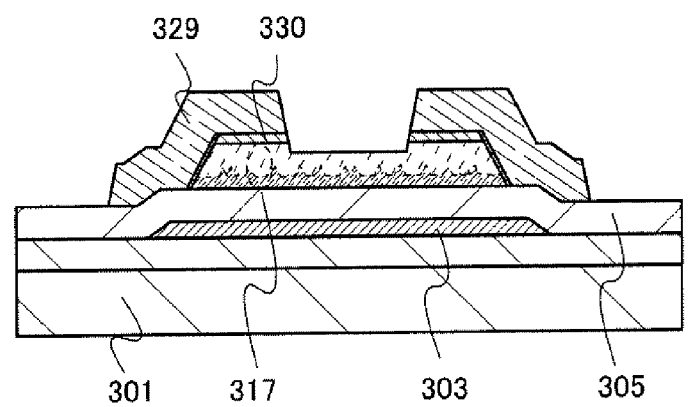

After that, the resist mask was removed. The structure provided through the steps up to here is illustrated in FIG. 16B.

Next, the surface of the semiconductor layer 317 was irradiated with carbon fluoride plasma, so that an impurity remaining on the surface of the semiconductor layer 317 was removed. Here, the etching conditions were as follows: the source power was set to 1000 W; the bias power was set to 0 W; the pressure was set to 0.67 Pa; and the etching gas was carbon fluoride at a flow rate of 100 sccm.

Next, a silicon nitride layer was formed as an insulating layer 337. As the deposition conditions, $SiH_4$, $NH_3$, nitrogen, and hydrogen were introduced as a source gas at flow rates of 20 sccm, 220 sccm, 450 sccm, and 450 sccm, respectively; further, the pressure in the treatment chamber was set to 160 Pa, the substrate temperature was set to 250° C., and plasma discharge was performed at output of 200 W, whereby the silicon nitride layer with a thickness of 300 nm was formed.

Figure 16C:
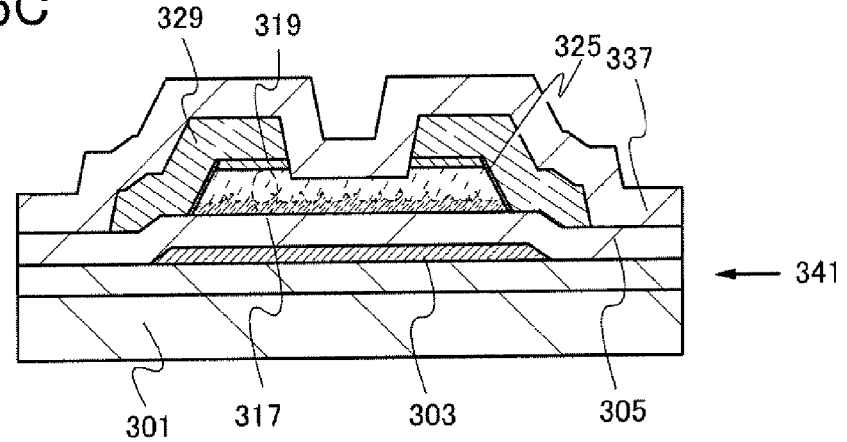

Next, although not illustrated in FIG. 16C, after the insulating layer 337 was coated with a resist, exposure using a fourth photomask and development were performed, so that a resist mask was formed. With use of the resist mask, the insulating layer was partly etched with a dry etching method, so that the wiring 329 functioning as the source and drain electrodes was exposed. In addition, part of the insulating layer 337 and part of the gate insulating layer 305 were etched with a dry etching method, so that the gate electrode 303 was exposed. After that, the resist mask was removed.

Though the above steps, a thin film transistor 341 was manufactured (see FIG. 16C).

Figure 17:
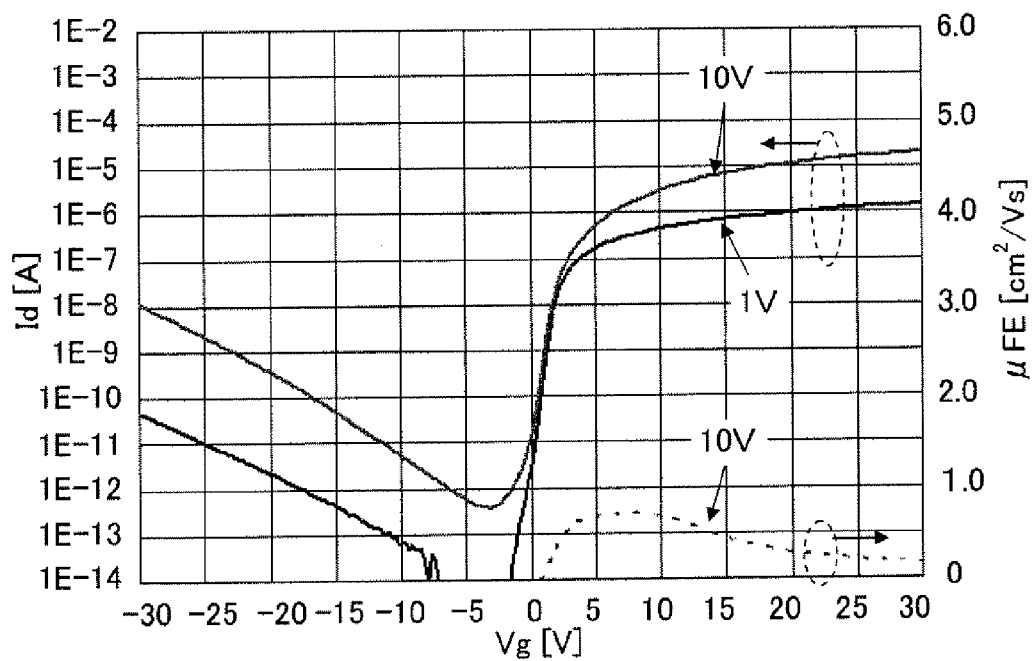
FIG. 17 is a graph showing electric characteristics of a thin film transistor.
Figure 18A:
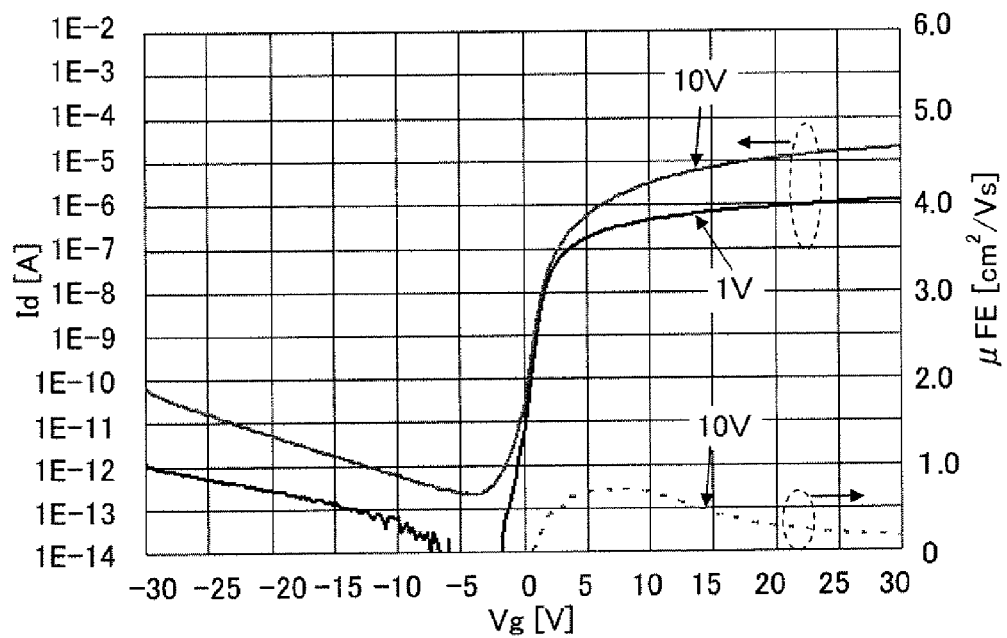
FIGS. 18A and 18B are graphs each showing electric characteristics of a thin film transistor.
Figure 18B:
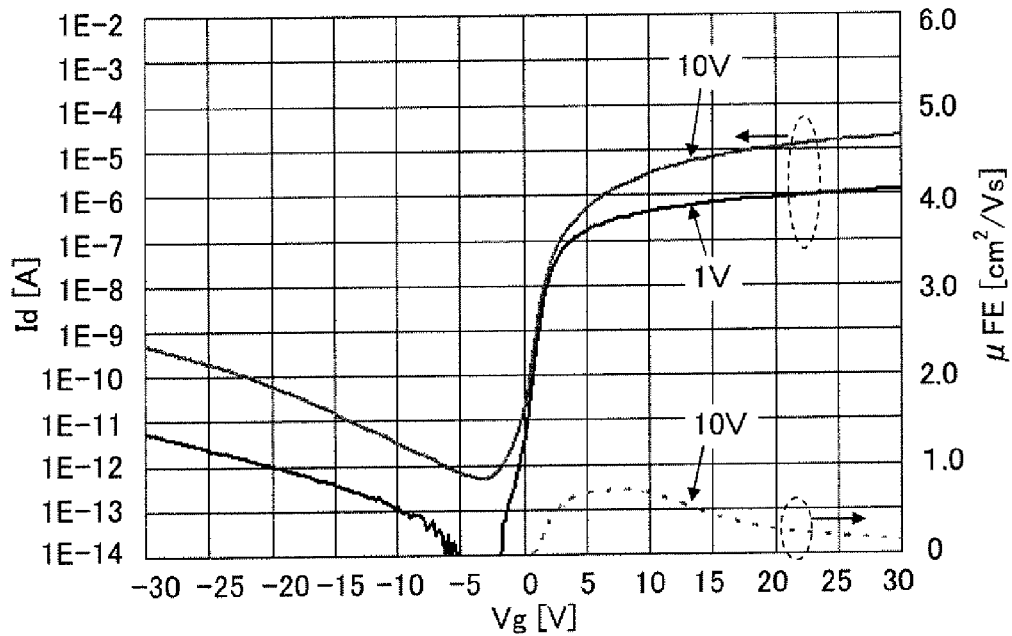

Next, FIG. 17 and FIGS. 18A and 18B show measurement results of electric characteristics of the thin film transistor. In each of FIG. 17 and FIGS. 18A and 18B, the horizontal axis indicates the gate voltage, the left vertical axis indicates the drain current, and the right vertical axis indicates the field-effect mobility. Current vs. voltage characteristics of when the drain voltage was 1 V and current vs. voltage characteristics of when the drain voltage was 10 V are represented by solid lines. Field-effect mobility of when the drain voltage is 10 V is represented by a dashed line. Note that the filed-effect mobility was calculated under the condition that the thin film transistor of this example had a channel length of 3.5 pun, a channel width of 19.7 μm, a thickness of the gate insulating layer of 220 nm, and an average permittivity of 5.17.

FIG. 17 shows electric characteristics of the thin film transistor of Sample 1. FIG. 18A shows electric characteristics of the thin film transistor of Sample 2, and FIG. 18B shows electric characteristics of the thin film transistor of Sample 3.

Table 1 shows, in each of the thin film transistors of Sample 1 to Sample 3, the on current of when the drain voltage was 10 V and the gate voltage was 15 V (represented by Ion (Vg=15 V)), the minimum off current (represented by Ioff (min)), the off current of when the voltage was smaller than the gate voltage at the minimum off current by 10 V (represented by Ioff (min. −10 V)), the off current of when the drain voltage was 10 V and the gate voltage was −30 V (represented by Ioff (Vg=−30 V)), the threshold voltage (represented by Vth), the subthreshold swing value (represented by S-value), and the field-effect mobility of when the drain voltage was 10 V ($\mu_{FE}$ (Vd=10 V)).

TABLE 1

|  |  | Sample 1 | Sample 2 | Sample 3 |
| --- | --- | --- | --- | --- |
| Ion(Vg = 15 V) | [μA] | 6.99 | 7.15 | 6.99 |
| Ioff(min.) | [pA] | 0.38 | 0.25 | 0.52 |
| Ioff(min. −10 V) | [pA] | 22.23 | 1.13 | 9.65 |
| Ioff(Vg = −30 V) | [pA] | 10948.00 | 64.95 | 487.54 |
| Vth | [V] | 1.58 | 1.43 | 1.60 |
| S-value | [V/dec.] | 0.49 | 0.48 | 0.50 |
| μFE(Vd = 10 V) | [cm$^2$/Vs] | 0.74 | 0.74 | 0.74 |

From Table 1, the values of the field-effect mobility of the thin film transistors of Sample to Sample 3 are the same as each other. However, the Ioff (min. −10 V) of Sample 1 is approximately 20 times that of Sample 2. Here, Ioff (min. −10 V) shows the jump of the off current, Sample 1 is the sample where the side surface of the semiconductor layer 317 was not exposed to the plasma 323, and Sample 2 is the sample where the side surface of the semiconductor layer 317 was exposed to the plasma 323. The Ioff (min. −10 V) of Sample 1 is approximately 2.2 times that of Sample 3 where the side surface of the semiconductor layer 317 was exposed to the plasma 323.

The Ioff (Vg=−30 V) of Sample 1, where the side surface of the semiconductor layer 317 is not exposed to the plasma 323, is 100 times or higher that of Sample 2 where the side surface of the semiconductor layer 317 is exposed to oxygen plasma as the plasma 323. Further, the Ioff (Vg=−30 V) of Sample 1 is 20 times or higher that of Sample 3 where the side surface of the semiconductor layer 317 is exposed to argon plasma as the plasma 323.

According to the above, as in Sample 2 and Sample 3, when the side surface of the semiconductor layer 317 is exposed to the plasma 323 and an insulating region or an amorphous region is provided on the side wall of the semiconductor layer 317, the off current of the thin film transistor can be reduced. Thus, with use of the thin film transistor having a structure of Sample 2 or Sample 3 for a display device, a pixel can have the small storage capacitor and the high aperture ratio; accordingly, the display device can achieve high image quality and high definition.

This application is based on Japanese Patent Application serial no. 2009-289838 filed with Japan Patent Office on Dec. 21, 2009, the entire contents of which are hereby incorporated by reference.

What is claimed is:

1. A thin film transistor comprising:
a gate electrode;
a gate insulating layer over the gate electrode;
a back-gate electrode;
an insulating layer in contact with the back-gate electrode;
a semiconductor layer;
an impurity semiconductor layer;
a barrier region on a side surface of the semiconductor layer; and
a wiring,
wherein the semiconductor layer, the impurity semiconductor layer, and the wiring are provided between the gate insulating layer and the insulating layer,
wherein the semiconductor layer comprises a microcrystalline semiconductor region having a plurality of conical projections and a first amorphous semiconductor region.

2. The thin film transistor according to claim 1, wherein the gate electrode and the back-gate electrode are electrically connected to each other.

3. The thin film transistor according to claim 1, wherein the first amorphous semiconductor region is divided, and the microcrystalline semiconductor region in a region overlapping with the gate electrode is partly exposed.

4. The thin film transistor according to claim 1, wherein the barrier region is an insulating region.

5. The thin film transistor according to claim 4, wherein the insulating region comprises semiconductor nitride or semiconductor oxide.

6. The thin film transistor according to claim 1,
wherein the barrier region is a second amorphous semiconductor region, and
wherein a band gap of the barrier region is wider than a band gap of the microcrystalline semiconductor region.

7. The thin film transistor according to claim 6,
wherein the band gap of the microcrystalline semiconductor region is equal to or greater than 1.0 eV and equal to or less than 1.2 eV, and
wherein the band gap of the barrier region is equal to or greater than 1.6 eV and equal to or less than 1.8 eV.

8. The thin film transistor according to claim 1, wherein the barrier region comprises a second amorphous semiconductor region on the side surface of the semiconductor layer and an insulating region on the second amorphous semiconductor region.

9. The thin film transistor according to claim 1, wherein the thin film transistor is incorporated in one selected from the group consisting of an electronic book reader, a television set, a digital photo frame, and a portable computer.

10. A thin film transistor comprising:
a gate electrode;
a gate insulating layer over the gate electrode;
a back-gate electrode;
an insulating layer in contact with the back-gate electrode;
a semiconductor layer;
an impurity semiconductor layer;
a barrier region on a side surface of the semiconductor layer; and
a wiring over the impurity semiconductor layer and over the barrier region, the wiring being electrically connected to the impurity semiconductor layer,
wherein the semiconductor layer, the impurity semiconductor layer, and the wiring are provided between the gate insulating layer and the insulating layer,
wherein the semiconductor layer comprises a microcrystalline semiconductor region having a plurality of conical projections and a first amorphous semiconductor region.

11. The thin film transistor according to claim 10, wherein the gate electrode and the back-gate electrode are electrically connected to each other.

12. The thin film transistor according to claim 10, wherein the first amorphous semiconductor region is divided, and the microcrystalline semiconductor region in a region overlapping with the gate electrode is partly exposed.

13. The thin film transistor according to claim 10, wherein the barrier region is an insulating region.

14. The thin film transistor according to claim 13, wherein the insulating region comprises semiconductor nitride or semiconductor oxide.

15. The thin film transistor according to claim 10,
wherein the barrier region is a second amorphous semiconductor region, and
wherein a band gap of the barrier region is wider than a band gap of the microcrystalline semiconductor region.

16. The thin film transistor according to claim 15,
wherein the band gap of the microcrystalline semiconductor region is equal to or greater than 1.0 eV and equal to or less than 1.2 eV, and
wherein the band gap of the barrier region is equal to or greater than 1.6 eV and equal to or less than 1.8 eV.

17. The thin film transistor according to claim 10, wherein the barrier region comprises a second amorphous semiconductor region on the side surface of the semiconductor layer and an insulating region on the second amorphous semiconductor region.

18. The thin film transistor according to claim 10, wherein the thin film transistor is incorporated in one selected from the group consisting of an electronic book reader, a television set, a digital photo frame, and a portable computer.

* * * * *